(12) United States Patent
Beckman

(10) Patent No.: US 11,975,426 B2
(45) Date of Patent: May 7, 2024

(54) REMOTE MONITORING AND ACTUATION OF FASTENERS

(71) Applicant: Christopher V. Beckman, Miami, FL (US)

(72) Inventor: Christopher V. Beckman, Miami, FL (US)

(*) Notice: Subject to any disclaimer, the term of this patent is extended or adjusted under 35 U.S.C. 154(b) by 314 days.

(21) Appl. No.: 17/564,027

(22) Filed: Dec. 28, 2021

(65) Prior Publication Data

US 2022/0118590 A1 Apr. 21, 2022

Related U.S. Application Data

(63) Continuation-in-part of application No. 16/537,696, filed on Aug. 12, 2019, now Pat. No. 11,207,765, which is a continuation-in-part of application No. 15/196,023, filed on Jun. 28, 2016, now Pat. No. 10,377,025, which is a continuation-in-part of application No. 13/441,832, filed on Apr. 6, 2012, now Pat. No. 9,375,828.

(51) Int. Cl.
| | |
|---|---|
| *B25B 23/147* | (2006.01) |
| *B25B 21/00* | (2006.01) |
| *B25B 23/00* | (2006.01) |
| *G01L 5/24* | (2006.01) |
| *G01R 33/028* | (2006.01) |

(52) U.S. Cl.
CPC ........ *B25B 23/1475* (2013.01); *B25B 21/008* (2013.01); *B25B 23/0007* (2013.01); *G01L 5/24* (2013.01); *G01R 33/0283* (2013.01)

(58) Field of Classification Search
CPC ..... B25B 23/147; B25B 15/001; B25B 23/12; B25B 23/08; B25B 21/00; B25B 15/005
See application file for complete search history.

(56) References Cited

U.S. PATENT DOCUMENTS

| | | | |
|---|---|---|---|
| 7,066,062 B2 * | 6/2006 | Flesher | F16B 23/0023 81/450 |
| 2008/0289839 A1 * | 11/2008 | Hricko | B25B 23/0064 173/4 |

* cited by examiner

*Primary Examiner* — Nathaniel C Chukwurah

(57) ABSTRACT

Improved techniques for remotely monitoring and managing fasteners and fastener driver conditions, are provided. In some aspects of the invention, conditions of a fastener and/or structural material(s) held by the fastener and/or connector, are monitored by a control system including sensor(s) at least partially embedded in, on or throughout the fastener and/or structural material(s). When an adverse condition is sensed, a torque may be remotely applied to the fastener, in some embodiments. In some embodiments, other remedial actions may be taken by the control system. In some embodiments, such sensor(s) include a magnetizable array, which may include one or more charge-carrying and/or otherwise magnetic wires or particles on, about, or embedded within, the fastener and/or structural material. In some embodiments, such remote monitoring includes testing a magnetic signature of the fastener and/or structural material (e.g., via remote scanning and/or testing).

16 Claims, 18 Drawing Sheets

© 2012 Christopher V. Beckman

© 2012 Christopher V. Beckman

REMOTE MONITORING AND ACTUATION OF FASTENERS

CROSS-REFERENCE TO RELATED APPLICATION

This application is a continuation in-part of U.S. application Ser. No. 16/537,696, filed on Aug. 12, 2019, now U.S. Pat. No. 11,207,765, which is a continuation of U.S. patent application Ser. No. 15/196,023, filed on Jun. 28, 2016, now U.S. Pat. No. 10,377,025, which is a continuation-in-part of U.S. application Ser. No. 13/441,832, filed on Apr. 6, 2012, now U.S. Pat. No. 9,375,828, the entire contents each of which are hereby incorporated by reference into the present application for all purposes as if fully set forth herein.

INTELLECTUAL PROPERTY NOTICE

Copyright and Trademark Notice: © Copyright 2012-2021 Christopher V. Beckman. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Unless otherwise stated, all trademarks disclosed in this patent document and other distinctive names, emblems, and designs associated with product or service descriptions, are subject to trademark rights. Specific notices also accompany the drawings incorporated in this application; the material subject to this notice, however, is not limited to those drawings.

FIELD OF THE INVENTION

The present invention relates to the field of mechanical fasteners and connectors, fastener and connector drivers and other physical fastening, connecting and fastener and connector driving techniques.

BACKGROUND

Mechanical wrenches and screw, bolt or other fastener drivers have been in use for many years. Likewise, the problem of mechanical drive tools stripping or breaking driven fasteners or applying improper or undesired levels of torque or force has been long-felt in the arts of construction and mechanical engineering, and probably dates from the earliest wrenches.

Torque wrenches have been available for many years and, generally speaking, allow a user to pre-set an amount of levered force (torque) as a maximum to be applied to a bolt connector/fastener being tightened by the wrench. Beyond that preset amount of torque, the torque wrench driver will mechanically slip from the wrench handle, rotating more freely with respect to it, and therefore without applying a higher torque.

In addition, a wide variety of remediation techniques have been suggested or attempted to address the problem of fastener heads, threads or other parts stripping or breaking due to driving, or due to stress or strain after driving. Typically, "How to" guides, such as those found on eHow.com, provide a variety of potential solutions for extracting stripped screws, bolts or other fasteners, ranging from jury-rig solutions such as cutting a new notch into a stripped screw head for new traction, to complex equipment and approaches such as extractors or welding ancillary bolts onto a stripped bolt. See, e.g., eHow, How to Remove Stripped Screws and Bolts, available on the Internet at eHow.com, accessed on Apr. 1, 2012.

The type of stripping or other damage that may occur from overdriving a fastener varies by driver tip type. Phillips head screwdrivers are designed to "cam out" beyond an amount of torque that varies based on the exact fastener head and driver tip type and on the pressure applied into those heads. In this way, the threads of Phillips screws and holes in a fastened material into which they are driven are often spared from stripping, but continued rotation of the driver against the head, after camming-out, typically strips the screw head. Robertson screwdrivers and heads, by contrast, resist camming out, but create a greater risk of thread stripping.

With almost any driver tip, provided that enough torque and pressure are applied against a strong enough fastener head and hole in the material, a more radical fastener driving failure can happen, such as the fastener (e.g., a screw) shearing or otherwise breaking off into pieces, or bending. Removing stripped fasteners can be very difficult and expensive, involving collateral damage and specialized extraction tools. And removing sheared or broken fasteners can be even more difficult and expensive due to difficulties in grabbing a buried part of the fastener that has broken off inside a connected element.

SUMMARY OF THE INVENTION

Improved techniques for remotely monitoring and managing fasteners and fastener driver conditions, are provided. In some aspects of the invention, conditions of a fastener and/or structural material(s) held by the fastener and/or connector, are monitored by a control system including sensor(s) at least partially embedded in, on or throughout the fastener and/or structural material(s). When an adverse condition is sensed, a torque may be remotely applied to the fastener, in some embodiments. In some embodiments, other remedial actions may be taken by the control system. In some embodiments, such sensor(s) include a magnetizable array, which may include one or more charge-carrying and/or otherwise magnetic projections, such as wires or particles on, about, or embedded within, the fastener and/or structural material. In some embodiments, such remote monitoring includes testing a magnetic signature of the fastener and/or structural material (e.g., via remote scanning and/or testing).

In other aspects, a powered driver bit is used also as a sensor for detecting proper orientation and contact (a.k.a., "seating" or "registering") with a fastener and, upon sensing improper contact, reduces, alters or removes power applied to the fastener. In a preferred embodiment, more than one contacts separated and insulated from one another on a driver bit permit the driver bit to sense proper contact with protrusions of a fastener head by using the fastener itself to complete a circuit between the contacts. In another embodiment, a distance-sensing probe or piton-like protrusion in a driver bit, along with a distance analyzing power delivery system, cuts and/or reverses power upon sensing a distance substantially greater than that set upon camming the driver bit into or onto the fastener head. In still other embodiments, a driver tip may include slide-locking reverse-grip members that pull the driver tip into the seated position, which is especially helpful when first beginning to screw-in a fastener, or when removing a fastener under light load, and a second hand of a human user is not available for the operation to help drive or remove a fastener.

In other aspects of the present invention, multiple-section fastener sets are provided, which may be self-tightening, reducing the need for precautionary over-tightening which also frequently strips fasteners and connectors and damages fastened and connected materials. In a preferred embodiment, a sensory change associated with deployment of the self-tightening system, or of separation between two sections of the fastener, creates a detectable condition of potential tightening energy being expended and/or loosening occurring, allowing an external distant (such as radiative) or contact sensor to sense such a condition and pin-point a fastener that has loosened, slipped, or that otherwise may be in need of recharging or tightening. Multiple section fastener sets allow an anchor piece (or "section") to be augmented by different variable-length head pieces, allowing the same anchor piece to remain in place while different head pieces may be changed out for different connection and fastening applications. In another embodiment, the fastener head may selectively break away before stripping, for example, only when tightening torque exceeds a threshold, and thereby expose a stronger, secondary driver head, which may be smaller, stronger and more deeply embedded in a fastened material(s), for use in removing an anchor unit.

In other aspects of the present invention, multiple-anchor-point intermediate matrices are used with ports that accept both fasteners and movable anchoring deep structures into which other fasteners may be inserted. These aspects allow a user to apply many fasteners in many various positions to distribute load, for example, along a soft wall, while, at the same time, strong ports are provided for immediate fasteners for an appliance to be mounted on the wall, to extend the example, at selected positions for such fasteners.

Associated driver refinements are also provided, including driver systems that detect proper seating of a driver tip with a fastener head and/or actual tightness of connected materials and tension on fasteners, rather than tightening torque alone. For example, in certain embodiments of the present invention, a driver system may power a driver bit such as those discussed above, and detect proper seating of the driver bit, as analyzed by a hardware and software system, and cause the driver bit to become unpowered or reverse-powered in the event that substantial and sustained tightening torque requirements change beyond programmable thresholds. As another example, in conjunction with certain embodiments related to multiple section fastener head sets, discussed above, such an auxiliary system may rapidly scan a variety of seated fasteners to determine tightness conditions and, if insufficient or improper tightness is detected, may provide location or other identifying information for such affected fasteners to a user of the system.

Within the context of this application, unless otherwise indicated, the following terms have the specific meaning described herein:

"Cam out," in addition to its ordinary meaning and its special meaning in the art, refers to the phenomenon where a driver tip for a screw or bolt driver tends to disengage and no longer register with a screw that it has been driving due to a torque that is too great in relation to pressure applied to cause the driver tip to register, and due to the shape of the driver tip and/or screw or bolt head.

"Register," or "seating," in addition to its ordinary meaning and its special meaning in the art, refers to the condition where a screw or bolt driver tip presses into a screw or bolt head in a proper orientation to its maximum depth and collides with inner surfaces of the screw or bolt or other fastener head and the fastener is properly aligned for being connected with another material.

"Strip" or "Stripping," in addition to its ordinary meaning and its special meaning in the art, refers to the damaging of fastener or connection target material threads, fastener heads, or driver tips or other damage due to over-torquing and/or improper orientation, registration, applied force or pressure or seating with one another.

"Over-torquing," in addition to its ordinary meaning and its special meaning in the art, means applying too much torque for the fastener and fastened/connected material to substantially sustain its operative shape and physical condition and without substantial deformation or other damage and/or without losing their operative fastening and/or connection abilities with respect to one another.

"Fastener," in addition to its ordinary meaning and its special meaning in the art, means any hardware device configured to mechanically join or affix two or more objects together. This application may use the alternative term "connector," for "fastener," and either term includes such hardware devices defined as a "fastener," above, including, but not limited to, such fasteners that do not create direct physical contact between the two or more objects when fastening them together (a.k.a., "bridging connectors.")

BRIEF DESCRIPTION OF THE DRAWINGS

The features and advantages of the example embodiments of the invention presented herein will become more apparent from the detailed description set forth below when taken in conjunction with the following drawings.

The embodiments set forth in detail in this application are to ease the reader's understanding of inventions set forth herein and, as such, are only examples of the virtually innumerable number of alternative embodiments falling within the scope of the application. No specific embodiment set forth in this application should be read as limiting the scope of any claimed inventions.

These and other aspects of the invention will be made clearer below, in other parts of this application. This Summary, the Abstract, and other parts of the application, are for ease of understanding only, and no part of this application should be read to limit the scope of the invention, whether or not it references matter also set forth in any other part.

DETAILED DESCRIPTION OF THE DRAWINGS

The features and advantages of the example embodiments of the invention presented herein are directed to new forms of remotely monitored and managed fasteners, and methods for their manufacturing and use, which are now described herein. These and other aspects will become more apparent from the detailed description set forth below when taken in conjunction with the following drawings. This description is not intended to limit the application to the embodiments presented herein, which are only examples of the virtually unlimited possible embodiments falling within the scope of the present application. In fact, after reading the following description, it will be apparent to one skilled in the relevant art(s) how to implement the following example embodiments in alternative embodiments, including any possible order, number or other arrangement of components and sub-components (the following order, components, subcomponents and/or relationships being non-limiting).

Figure 1:
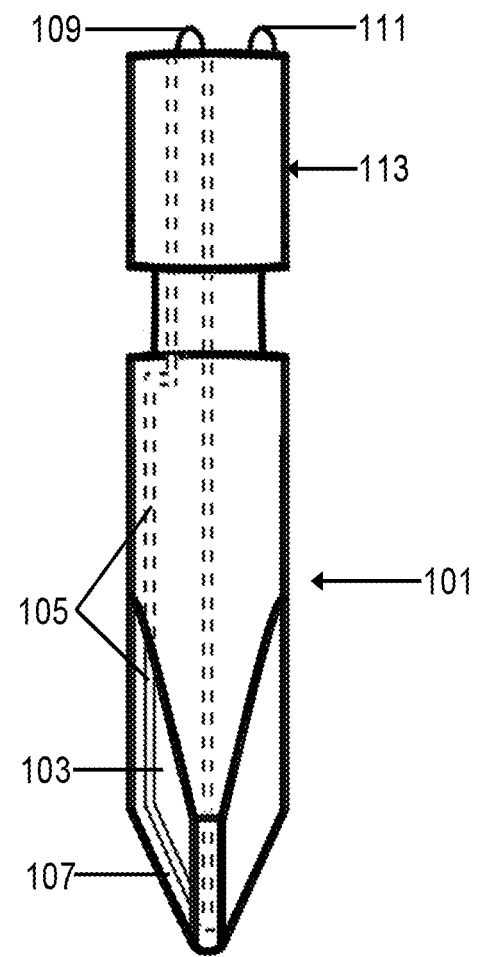
FIG. 1 is a side-view of an exemplary preferred driver bit for a powered screwdriver for use in a system preventing or reducing stripping or other fastening-associated damage, according to aspects of the present invention.

FIG. 1 is a side-view of an exemplary preferred driver bit for a powered fastener driver for use in a system for preventing or reducing thread stripping or other fastening-associated damage or collateral damage, according to aspects of the present invention. When properly seated into the head of a fastener, an interfacing male driver bit 101, shaped, in this example, as a Phillips style screwdriver tip, would penetrate a complimentary female fastener head (not pictured) until their interfacing surfaces touch and properly seat. A conductive inner section 103 of the driver bit would then contact a complementary projection of the fastener head (not pictured). An insulating layer 105 electrically insulates the conductive inner section 103 from a conductive outer section 107. Also when properly seated, the conductive outer section would touch and allow electrical conduction with, the fastener. Thus, when properly seated, both the inner conductive section and the outer conductive section would be in contact with a fastener and, if the fastener is constructed of conductive or otherwise electrically or magnetically affecting material, bridging or bridging prevention effects may be detected by an attached system, which therefore may sense or assume that proper seating is taking place. Likewise, in the absence of sensing electrical characteristics associated with proper seating, the system may assume that proper seating is not, or is no longer, taking place. The system may then eliminate or even reverse power (as in a reverse pulse to remove potential fastener or driver bit damaging torque). To equip such an external drive control system for the performance of such sensory and action duties, contacts 109 and 111, at the end of the driver bit may be attached to the remainder of the driver and drive system via grip/interfacing section 113, allow communication between separate system contacts (not pictured) and the inner and outer conductive sections—103 and 107, respectively. In a preferred embodiment, the system creates a non-spark generating anode and cathode of the inner and outer conductive sections and, when properly seated, an electrical circuit is completed to signal to the system that proper seating with a fastener head is occurring or, if the circuit is broken, is not occurring. But non-spark generating electrical characteristic sensing may even more preferably be used, to avoid the risk of inadvertent sparks in certain applications.

Although a Phillips style driver tip with separate conducting volumes and contacts within that design are used in the example of FIG. 1, it should be understood that any detectable separation of sections of any type of driver tip and complementarily usable fastener head may be used, and still carry out aspects of the present invention. Any detectable proper contact or orientation from separately sensing regions of a driver with respect to a fastener may be used instead of the exact implementation pictured in FIG. 1.

Figure 2:
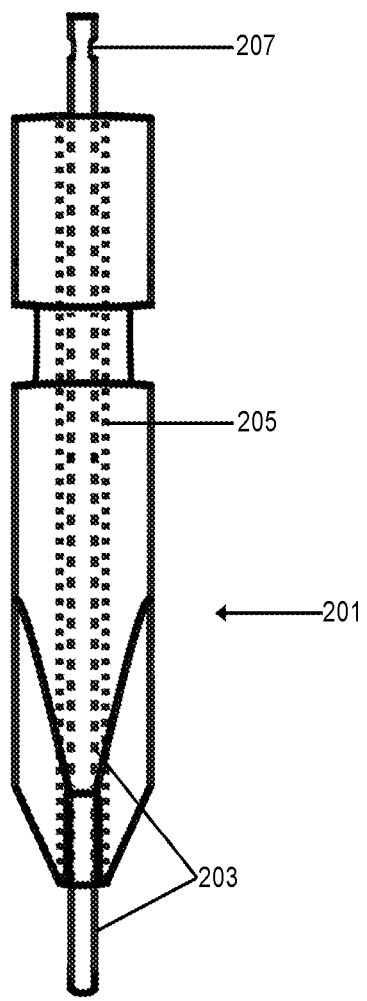
FIG. 2 is a side-view of another exemplary driver bit for a powered screwdriver for use in a system preventing or reducing stripping or other fastening-associated damage, according to aspects of the present invention.

FIG. 2 is a side-view of another exemplary driver bit 201 for a powered fastener driver for use in a system preventing or reducing thread stripping or other fastening-associated damage, according to aspects of the present invention. In this example, detection of proper driver bit seating within a fastener head may be achieved by virtue of one or more compressible or slidable projecting sensory-associated members, such as member 203. As will be explained in greater detail, with respect to FIGS. 3 and 4, upon proper engagement and seating with a complimentary fastener head, sliding member 203 will collide with a feature in a complementary fastener head and slide upward to a substantially resting position associated with proper engagement with the fastener head, and a drive system may register that distance information and compare further readings to execute powering decisions. The member 203 extends internally into driver bit 201 through a central channel 205. As will be explained with respect to FIG. 3, force-bearing mechanisms with stopping controls are preferably used to maintain a more extended position of the member 203 when the driver bit is not fully deployed in a fastener head. A grabbing point 207 on the proximal end of the member 203 allows the remainder of the drive system to grab and take distance and deployment readings and execute powering commands in response, to a grabbing sensor. However, it is not essential that the distance sensor grab or even make direct contact with a projecting member to sense, and therefore carry out, those aspects of the present invention. It is also not essential that a single sensing member be used, or that the sensing member location or even an inner channel be used. For example, the outer flanges of the drive head might also be compressible or slidable to a range of distances or minimum distance for permitting the system to deliver driver power. It may be desirable in some applications to have more than one side-mounted, spring-loaded or otherwise force-biased sliding projections, such that all of their degrees of compression or sliding can be compared, allowing power only when substantially equal, or within a tolerance of similarity, to one another, because this will indicate that it is highly likely that the driver bit is seated evenly and at substantially the same angle as the fastener head.

Figure 3:
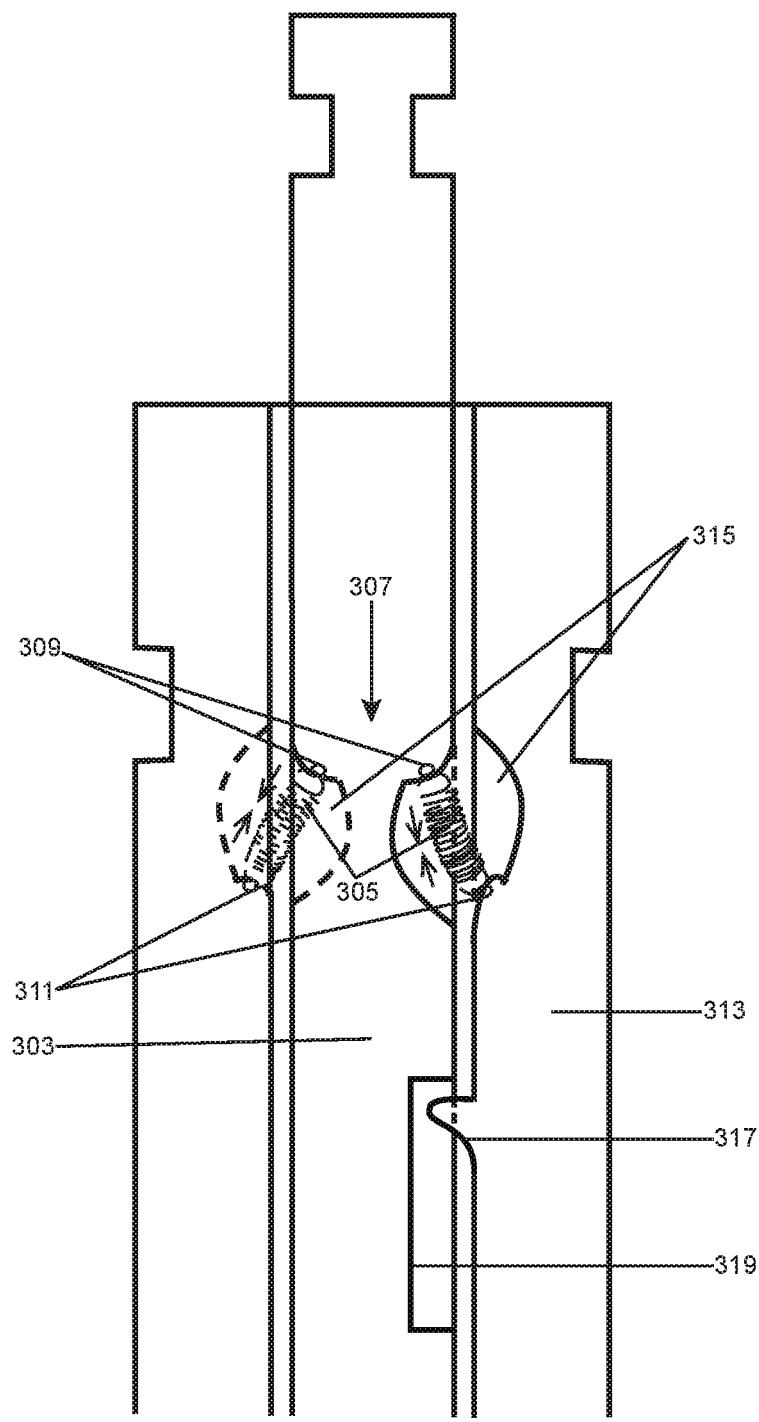
FIG. 3 is a partial view, with greater detail, of the exemplary driver bit for a powered screwdriver of FIG. 2.

FIG. 3 is an enlarged partial view, with additional detail, of proximal parts of the exemplary driver bit discussed with respect to FIG. 2. To bias a compressible or slidable projecting sensory member, such as member 303 (which corresponds to member 203 of FIG. 2), into an extended, probing direction corresponding with the direction of force line 307, compression forcing features, such as load springs 305, which are biased to provide contracting force and attach to attachment points 309 and 311 of both the housing 313 and member 303, respectively. Contoured walls surrounding the springs 305 provide cavities 315 allowing free movement of the springs regardless of the degree of projection of the member out of the driver bit. A movement stop member 317 associated with the housing 313, which travels in member notch 319, limits the range of motion of the member to allow its containment and management. Of course, many other means of controlling, limiting and forcing projection movement will be apparent to those of skill in the art, and may also be used, and the exact mechanisms shown in FIG. 3 are exemplary and may be preferred, but are not exhaustive.

Figure 4:
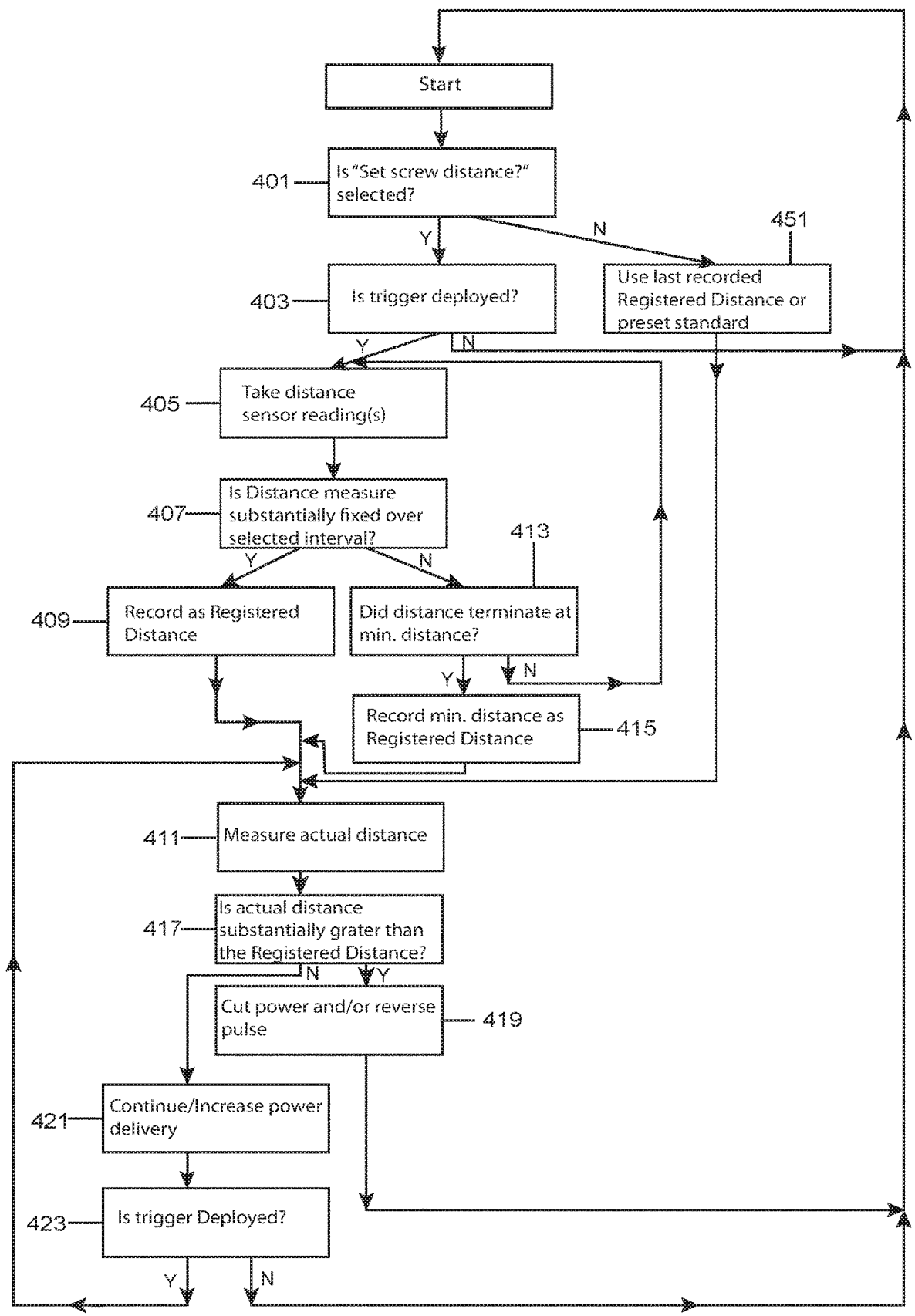
FIG. 4 is a chart describing exemplary programming for a hardware and software system that may be used in conjunction with the driver bit of FIGS. 2 and 3.

FIG. 4 is a flow chart of exemplary steps that may be taken by a system, such as a software and hardware system, in accordance with aspects of the present invention. Beginning with step 401, the system determines whether a command to "set screw" distance is selected, meaning that the user seeks to calibrate the system with a particular fastener with which the system is interfacing. For example, a user using the driver bit discussed with respect to FIGS. 2 and 3 may connect that driver bit to a motorized driver armature (not pictured) which attaches to both the grabbing point 207 at the proximal end of the driver bit discussed with respect to FIG. 2 and with the proximal end of the driver bit generally. The motorized driver armature is equipped with sensory-enabling hardware, such as a distance measurer to measure the extent of deployment of the member 203 and enable the system to be provided with distance readings. Thus, if the system is commanded to set screw distance, as in step 401, it first determines if a driving command, such as a trigger pull, has been made, in step 403, and, if so, the distance measurer takes distance reading(s) and provides it/them to the system in step 405. Proceeding to step 407, the system may assess whether a substantially fixed distance measurement has been provided over a selected interval, indicating that the driver bit is more likely to have come to a rest in a seated position, properly aligned in a fastener head. If the distance readings match readings for the member(s) being fully extended, the system may provide an "incompatible fastener" or similar error message, and return to the starting point of FIG. 4. But otherwise, if a substantially fixed distance is recorded, the system proceeds to step 409, and records the substantially fixed distance reading as the "Registered Distance" associated with proper seating of the driver bit within the fastener head, and the system proceeds to step 411. If, however, a substantially fixed distance is not sensed and relayed over the selected interval (which interval may, as one option, be selected from length of time that a set screw command is relayed and/or a partial trigger pull is made while not yet delivering driving power), then the system may resort via steps 413 and 415 to recording the minimum recorded distance substantially maintained over any sub-interval section of the interval, indicating the distance that most likely associates with the most seated position achieved by attempting to seat the driver bit into a fastener head, as the Registered Distance. Assuming that a command to set the screw distance has not been made at the initiation of the system steps shown in FIG. 4, the last recorded distance may be used as the Registered Distance, or a preset standard that may be matched to any, and, preferably, the latest distance measurement by any attempt to seat the driver bit, may be used as the Registered Distance—in step 451. But, turning our attention back to step 411, in the case of deployment after a Registered Distance has been selected from any possible avenue, the system proceeds to take measurements of the actual distance, for example, of a probing member, such as member 203, and, therefore, the presence of proper seating, of the driver bit with respect to the fastener head. If, in the proceeding step 417, the system determines that a distance substantially greater (which may coincide with the driver bit beginning to "Cam Out") than the Registered Distance has been measured, the system may cut power and/or reverse pulse the power driving the driver bit and fastener head, thereby eliminating or reducing stripping or other damage to the driver bit, fastener or fastened material(s), in step 419, and the system may return to the starting position. If, however, substantially the Registered Distance continues to be sensed during driving, the system may maintain, or even increase power, speed or torque (for example, in a graduated manner reaching a peak) in step 421 and continue the driving routine as long as a driving command (e.g., continued trigger pull requesting the system to drive a fastener) is maintained (step 423). In the event that the system is no longer commanded to drive, the system again may return to the starting state of FIG. 4.

Figure 5:
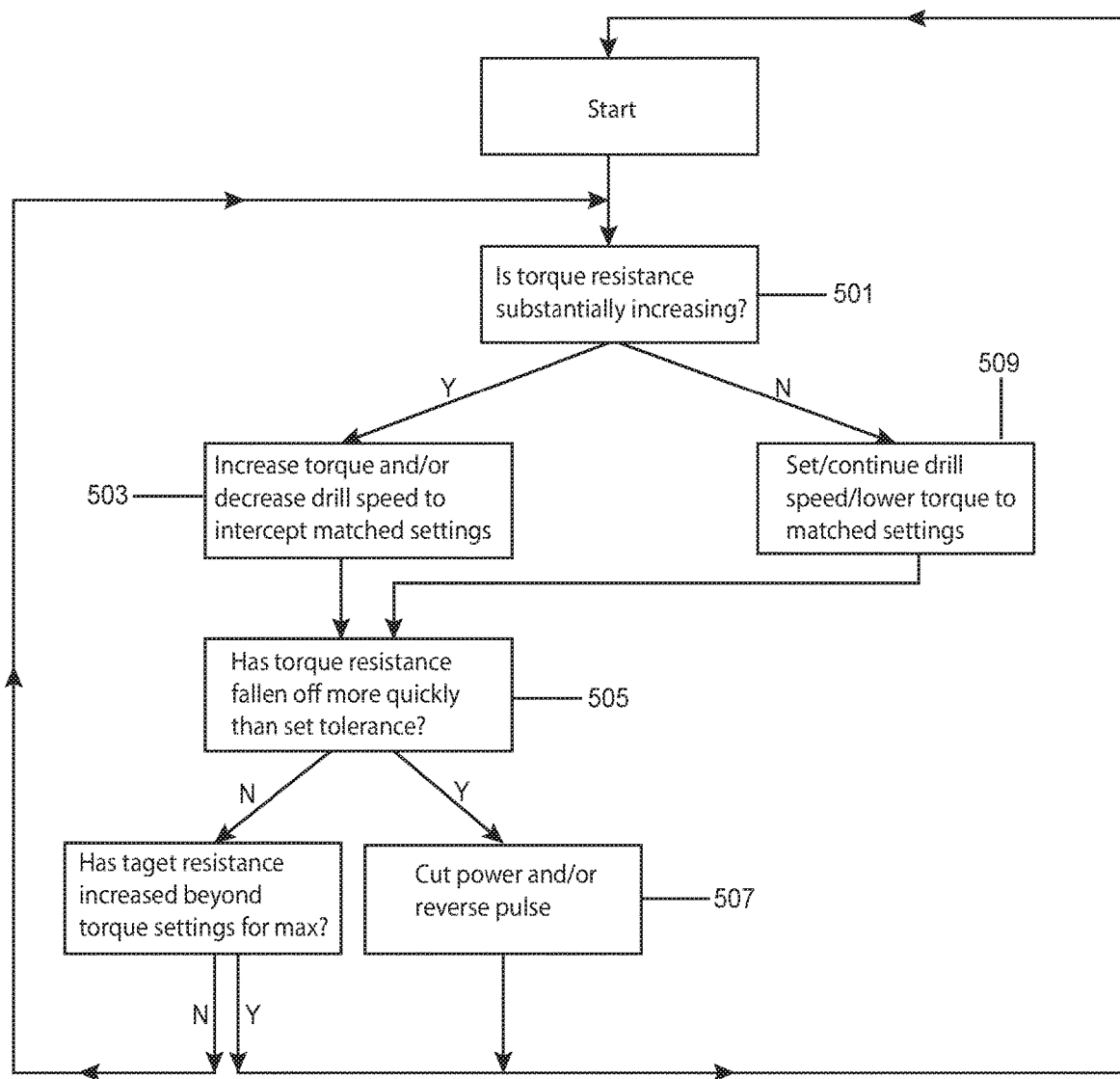
FIG. 5 is a chart describing exemplary programming for a hardware and software system that may be used to prevent and/or reduce stripping or other fastening-associated damage with an even wider variety of driver bits.

Proceeding to FIG. 5, an exemplary additional software and hardware routine is set forth for a fastener-driving system. This system also seeks to avoid driver-tip, fastener and connected material damage, but may or may not be used with the specialized driver bits discussed with respect to FIGS. 1-4. Beginning with step 501, the system takes torque or tightness readings over time from a torque or tightness sensor (not pictured) that measures and relays the applied torque of a driver bit to a fastener head or accomplished force of tightness between a fastener and/or connected material(s), and the system determines, given those readings, whether that torque or tightness is substantially increasing, as may be defined by settings defining substantial increases that may be user-adjustable. If so, the system may decrease driver bit speed and/or increase delivered torque to the driver bit and fastener head in step 503. Proceeding to step 505, the system may take torque or speed readings to determine whether slippage, associated with potential stripping and/or a sudden onset of decreased torque and/or driving resistance and/or decreased tightness is occurring, or if other readings indicating a potential connection failure and/or damage are provided to the system regarding a connection. If so, the system proceeds to step 507 and cuts power or reverses power to prevent further stripping or damage to the driver bit, fastener, or connected materials. If such a falloff is not detected in step 505, the system may continue to deliver power to the driver bit until a maximum torque or tightness setting is met or exceeded by torque and/or tightness readings, at which point, power is discontinued, and the system returns to the starting position. Likewise, if in step 501 the torque or tightness was not determined to be substantially increasing, the system may nonetheless proceed in step 509 to a preset drive setting (such as distance of embedding a fastener, or a number of turns) or may simply continue to apply the same torque and speed, proceeding to step 505.

Figure 6:
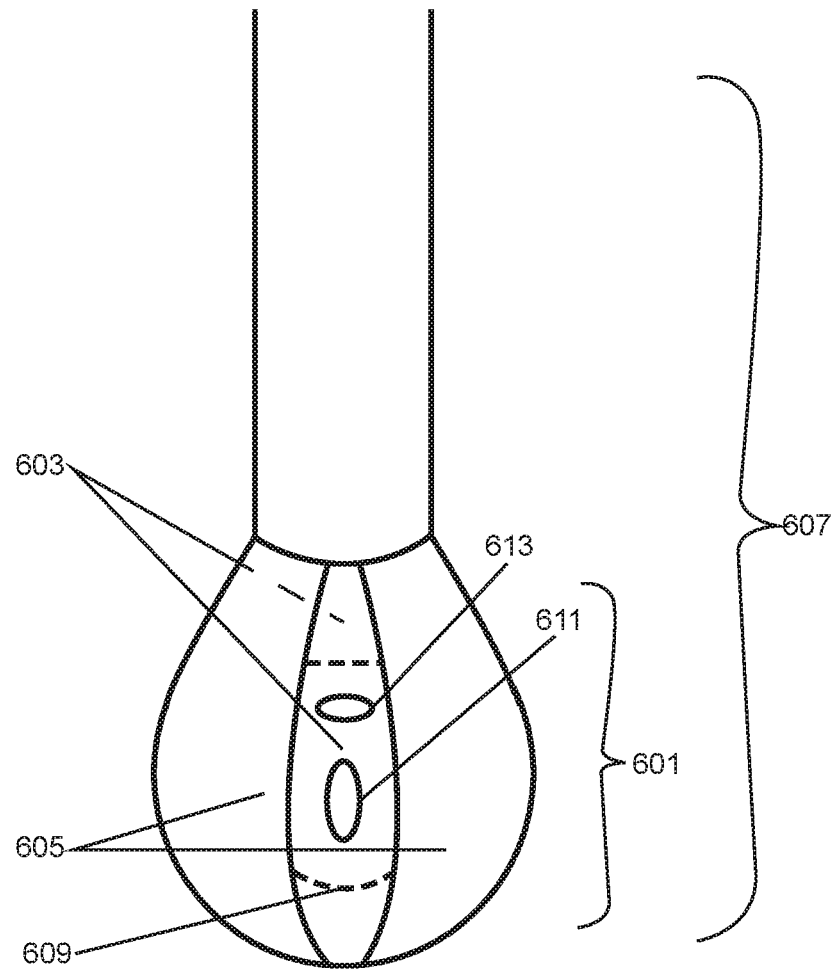
FIG. 6 depicts an exemplary driver tip according to aspects of the present invention that permits the alteration of deployment angle without reducing contact efficacy with a fastener head.

In FIG. 6, an alternate form of fastener driver tip is depicted. A section 601 with substantially semi-spherical convex leading contact surfaces and/or surface edges 603 and semi-spherical convex deeper (compared with the leading contact surfaces) contact surfaces and/or edges 605 are provided at the distal end of the driver tip. This section, 601, is intended for contact with complementary surfaces in a fastener head. While not essential to carry out aspects of the present invention, preferably, these complementary surfaces are concave semi-spherical deeper contact surfaces and concave semi-spherical leading contact surfaces, respectively, of a fastener head (not pictured)—to indicate the complementary order in comparison to the leading and deeper contact surfaces of the drive head, discussed above. As a result, a user and/or system that may drive the driver tip 607 may change the angle of the driver tip in infinite degrees, depending only on the limits of edges and projections at the deepest portion of both the driver tip and fastener head interface, which limit the degree of swiveling of the driver tip. If, for example, leading surface/edges 603 only project to the potential distal limit of the edge shown as 609, with corresponding point of highest surface elevation (out of the page, in the positive z-axis direction of the FIG. 611, thus, defining just that point of a complementary semi-sphere, the driver tip may be rotated toward the negative z-axis direction (into the page) until the edge 609 collides with a leading feature of the complementary fastener head. Preferably, and additional limiting edge of the opposing side of the driver tip, such as potential edge/limit 613, ensures proper contact, rather than prying away of contact surfaces in extreme executed rotation limits.

Figure 7:
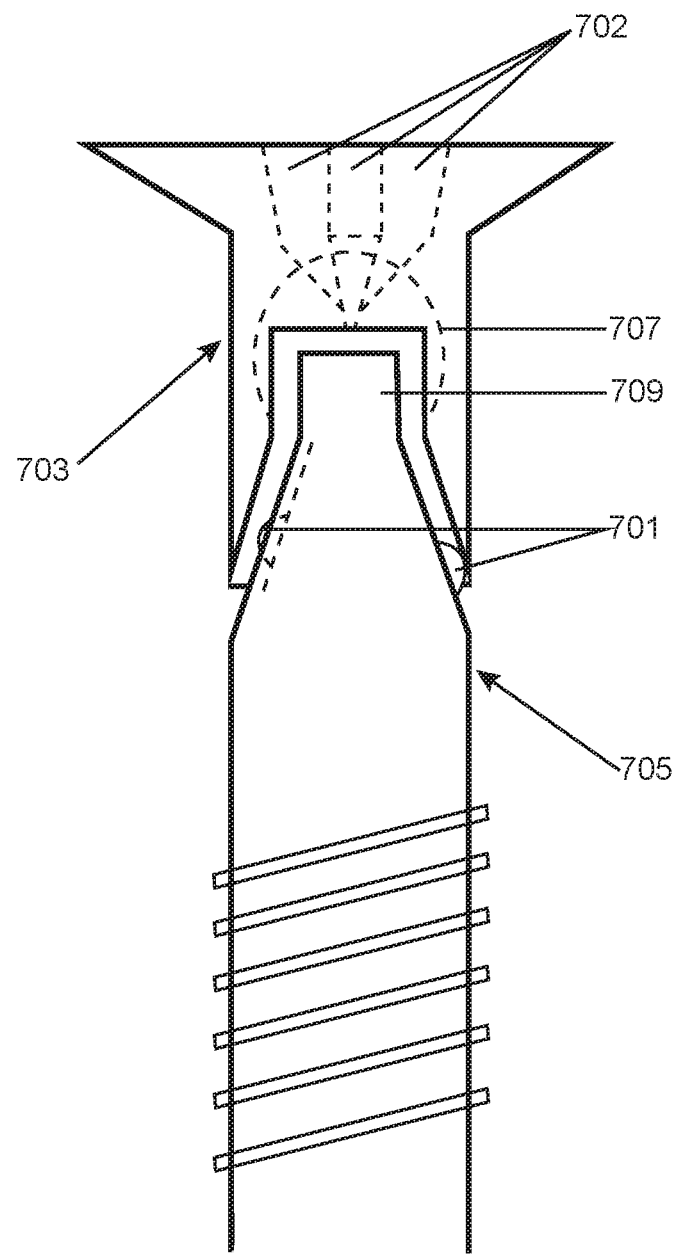
FIG. 7 is an exemplary fastener device with multiple sections for preventing, reducing and/or remediating fastener stripping.

FIG. 7 is an exemplary fastener device with multiple sections for preventing, reducing and/or remediating stripping and other associated damage. Connection/weld points 701 connect two major sections, fastener head section 703 and section 705 (the latter of which is partially pictured), which may be referred to as a fastener head section (with Phillips head inner shaping 702) and an anchor section, respectively. As torque may be applied to the fastener head section 703, a limit may be reached that causes the connection/weld points 701 to break, depending on the amount of resistance or other forces encountered in driving the fastener device into a material. Preferably, the connection/weld dynamics cause both connector/welds to break if either of them break, for example, due to greater twisting weakness and/or fragility than tensile strength weakness and/or fragility. The degree of force causing this break is selected to be below the deformation point for a majority of sections, or selected sections, of the threading and other structural features and/or the driver tip. As a result, fastener head section 703 will break away from anchor section 705 before major threading or other driver tip damage from over-torquing takes place. A protective cavity 707 provides protection for an auxiliary fastener head 709 located on the body of the anchor section, such that, in the event that such a protective de-coupling takes place, the sudden "snapping off" of the fastener head section from the anchor section will not inadvertently damage the auxiliary fastener head 709. Of course, the exact shape, type and number of the fastener heads, cavity(ies), auxiliary fastener head(s), connection/weld weld point(s) and anchor(s) are exemplary, and the present invention may be used with any number of alternative shapes and configurations.

Figure 8:
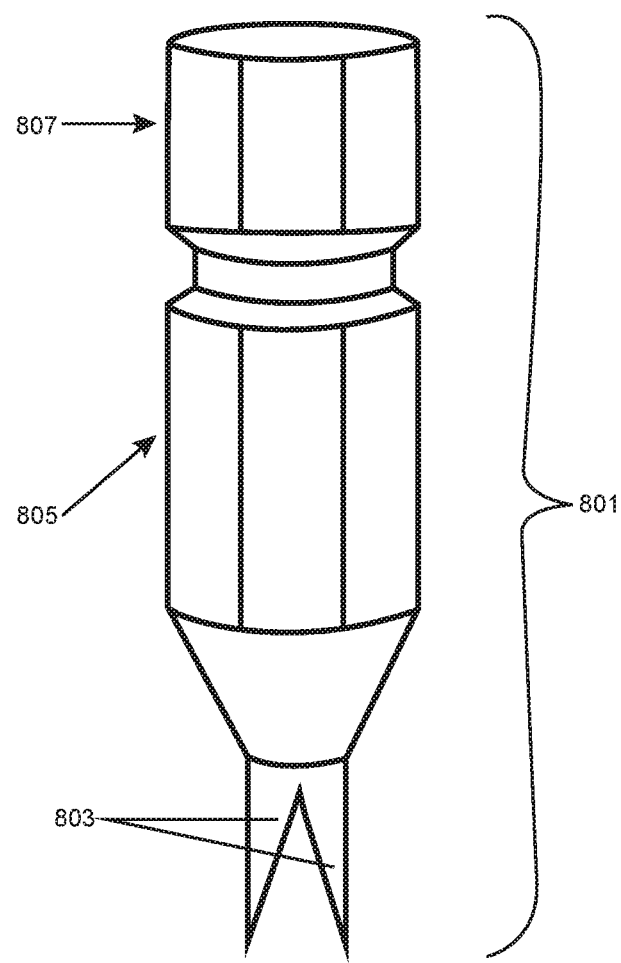
FIG. 8 is an exemplary removal tool, for executing the removal of part of the fastener device of FIG. 7 from a material in which it has become embedded.

In the event that a decoupling of the fastener head section 703 and anchor section 705 takes place, a specialized extractor driver tool 801 may be used, as described in FIG. 8. Interfacing tines 803 at the distal end of the driver tool 801 are complementary to and may seat with auxiliary fastener head 709, enabling a driver to remove the decoupled fastener anchor section from a material in which it is embedded. Although interfacing tines 803 are shown in a tapering V-shaped formation, it should be understood that a variety of additional shapes and configurations may provide a complementary shape for interfacing with an auxiliary fastener head. For example, tines or a socket with concave versions of the same shape as the auxiliary head may be used, as an alternative. However, a tapering formation, as pictured, is preferred because it enables one driver tool to be used with a variety of differently-sized auxiliary fastener heads. Body section 805 and gripping section 807, at the proximal end of the driver tool, permit a driving system or handle to be added to, gripping, the driver tool 801.

Figure 9:
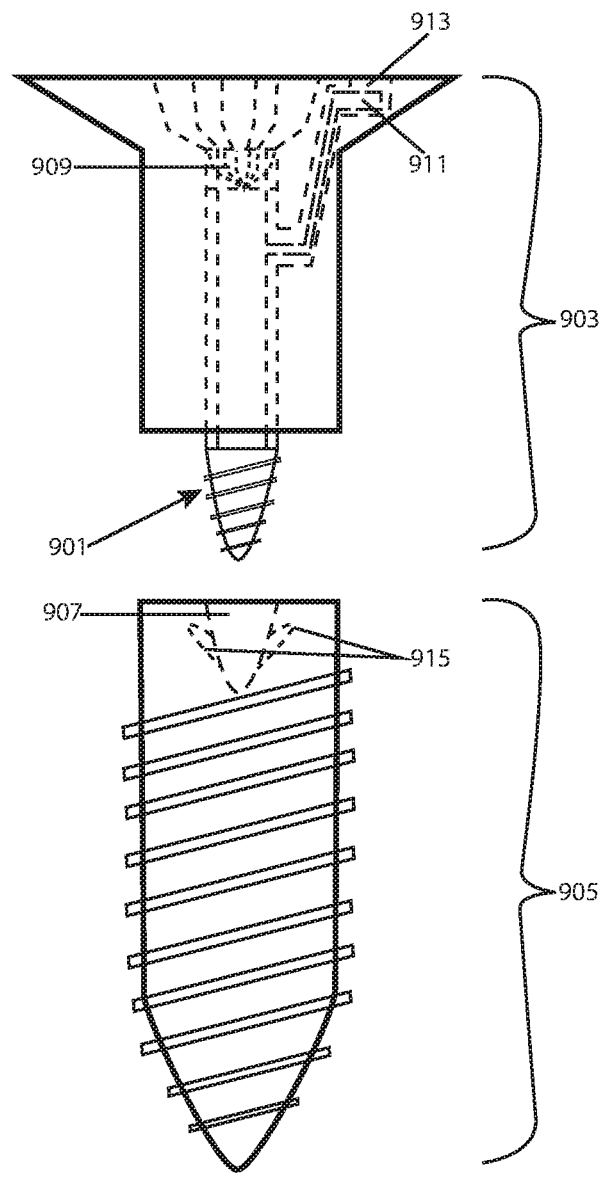
FIG. 9 is another exemplary multiple-sectioned fastener device for preventing, reducing and/or remediating fastener stripping, with the ability to signal undesired tightness, tightness pressure and other conditions.

FIG. 9 is another exemplary fastener device with multiple sections (a.k.a., a "multi-sectioned fastener") for preventing, reducing and/or remediating stripping. A central threaded fastening member 901 permits the joining and disjoining of a fastener head section 903 and an anchor section 905. The central fastening member 901 is free to spin within but more permanently joined to the head section 903 (for example, using rotational-guiding, interlocking grooves on both the member and the fastener head housing), and requires threading into a complementary port 907 in the anchor section to join sections 903 and 905. The central fastening member 901 may spin within, and be driven separately from, the remainder of the fastener head section 903 by use of an embedded member head 909, which requires a different specialized driver tip from that used to drive the entire fastener head. The torque setting (which sets a maximum torque up until the central member will begin to spin, preventing further tightening) may vary from interchangeable head-section to interchangeable head-section. Spinning of the head relative to the central member may be shown by a spin flag and viewing/chamber window, 911 and 913, respectively, or other spin condition indicator. A wide variety of different head sections, such as but not limited to 903, with differing central member characteristics, may be used, and may have a wide variety of torque settings, drive shapes and lengths, among any other changeable physical characteristics, to accommodate later or other different fastening or joining jobs using the same anchor section, even in the same anchored position in a material. One type of specialized head (not pictured) with barbs that fit into barb ports 915, may be used to prevent unauthorized removal of the fastener, or sections thereof, by, for example, twisting. In such an interchangeable fastener head, a key/key hole interface may be provided in place of the embedded member head 909, and threading of the connecting member may be omitted. The main head itself may have no conventional twisting or other attaching/decoupling interface, to prevent tampering.

In addition to condition indicators 911 and 913, as set forth in the example pictured in the figure, other appropriate means of signaling conditions of devices may be used, in addition or as an alternative, in some embodiments of the invention. For example, in some embodiments, the tightness of a fastener, or the failure of a physical connection of a device may be signaled by remote sensor readings, at least in part by a remote or other device not comprised within the exemplary fastener device with multiple sections, but connected or otherwise able to sense communicate signals with it. For example, in some such embodiments, an element within the exemplary fastener device with multiple sections may be readable by such a remote or other device not comprised within the exemplary fastener device with multiple sections. In some embodiments, such a remote or other device comprises a control system, such as the control system, set forth below, in reference to FIG. 15. In some embodiments, such a control system is configured to identify some aspect of the fastener device with multiple sections. For example, in some embodiments, such a control system is configured to identify the location of the of the fastener device with multiple sections. As another example, in some embodiments, a sub-optimal condition may be communicated to such a control system, through at least part of such a fastener device with multiple sections. As discussed above, in some embodiments, such a fastener device with multiple sections includes a movable element. As will be discussed below, in reference to FIG. 10, in some such embodiments, such a fastener device with multiple sections may comprise a flexible element. As also shown below, in reference to FIG. 10, outer ridges, of some form or another, may be present on multiple sections of such a fastener device with multiple sections. For example, in some embodiments, such outer ridges may be threading of various spacing and locations, such as the example threading shown on anchor section 905 and on anchor section 1003, and such as the example threading shown on central threaded fastening member 901. As another example, in some embodiments, such outer ridges may take a different form, such as that pictured as any of ridges 1021 of FIG. 10.

Figure 10:
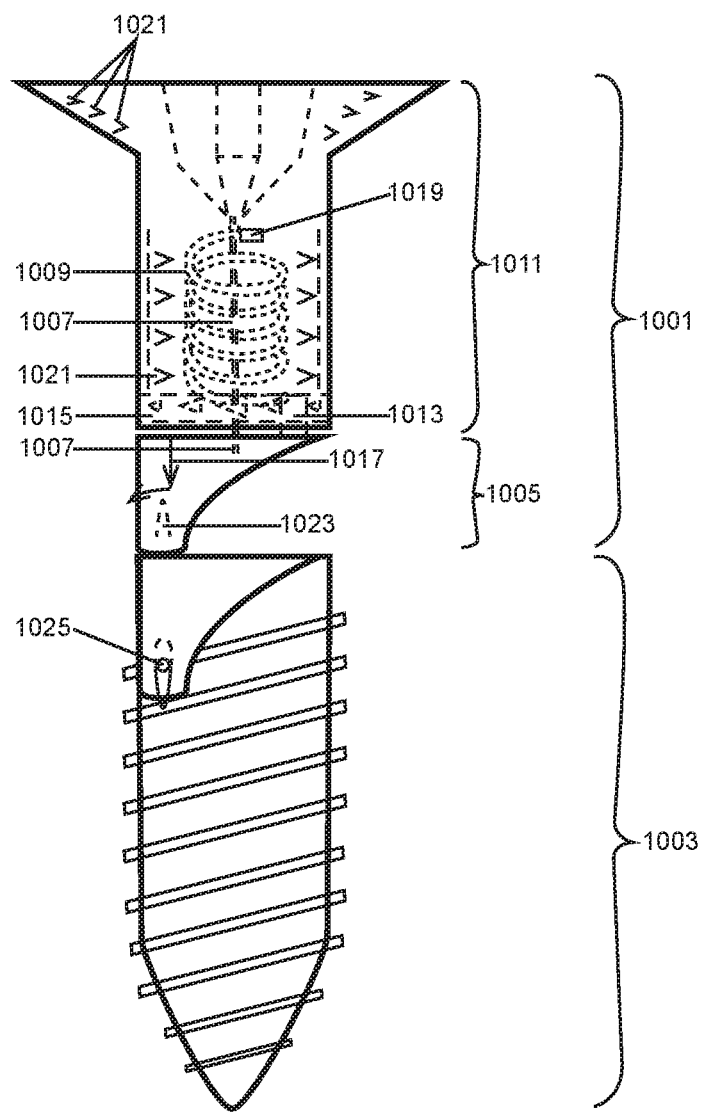
FIG. 10 is another exemplary multiple-sectioned fastener device for preventing, reducing and/or remediating fastener stripping, with the ability to continuously maintain and apply a tightening pressure or tightness-maintaining pressure, and with the ability to signal undesired tightness, tightness pressure and other conditions.

FIG. 10 is another exemplary fastener device with multiple sections for preventing, reducing and/or remediating fastener stripping. A fastener head section 1001 and fastener anchor section 1003 are provided. Fastener head section 1001 includes a rotatable conjoining armature 1005 which may spin around an axel 1007, and may be force-loaded, such as with spring loading by spring 1009. When in place as shown, substantially abutting the main chamber 1011 of the fastener head 1001, a flange 1013 extends into locking projections of a locking ring 1015. However, as explained by potential movement arrow 1017, the armature section 1005 may be pulled out of its abutting position to a second, distally-extended position, for example, as would naturally occur upon seating of the fastener head into a material after adequate tightening, because the anchor section will naturally pull away from the head section, into the material in which it is embedded, and will also pull on the conjoined armature, dragging it and its flange 1013, into an unlocked position (for example, defined by a tab and channel limit). In that event, force-load may be applied to the anchor section by the fastener head section, with the aid of a stored force device, such as spring 1009 attached to a point on the armature section (preferably, to the locking flange 1013 at a position that bypasses the locking features of ring 1015) and to a fixed point 1019 on the housing of the remainder of the fastener head section 1011, and also with the aid of external anchoring projections, such as anchoring ridges 1021, that resist movement due to the deployed, previously stored force. When the sections of the fastener are joined, a linking barb 1023 on the armature section 1005 is inserted into a barb receptor 1025, holding the two major sections together. Any number of other linking interfaces and armature shapes may also be used. An auxiliary locking ring, or projections allowing movement of the armature with respect to the main chamber 1011 only in the direction of its self-tightening movement, may be included, into which the flange 1013 engages upon pulling out into the force deploying, second, distally-extending position. Such an auxiliary locking flange will facilitate the removal of the fastener by counter-clockwise driving movement by a driver tip on the fastener head, especially if an additional tab prevents re-entry of the armature into the first position, locked with the first locking ring, 1015. Generally, if a ring formation were chosen to control movement for this extended armature position configuration, the ridges would be oriented in the opposite direction, and would be in a ring more distal, than with ridges of locking ring 1015, requiring a slightly longer housing and longer flange than pictured, including a bypassing gap for the more distal ring when the flange is engaged with the proximal ring, to allow proper positioning of the flange/lock interface section in the closed (abutting, which requires locking and placement of the flange only within the more proximal ring) and in the open (pulled away from the main head section 1011, which requires locking and placement of the flange only within the more distal ring).

Figure 11:
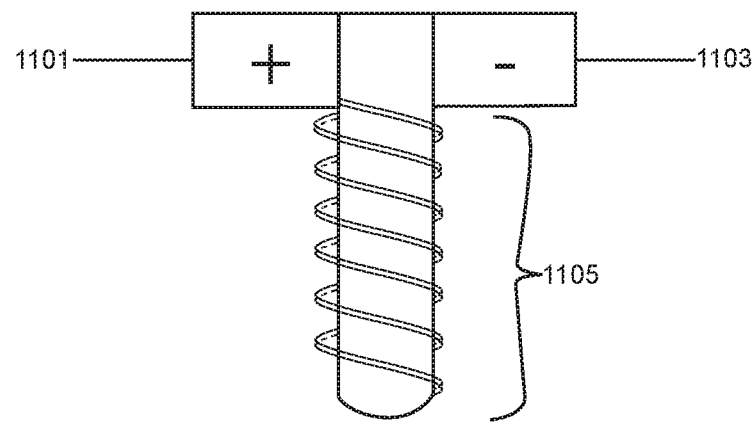
FIG. 11 depicts an exemplary magnetizable and/or magnetized and/or magnetically actuable fastener that may be used in accordance with a system for preventing or reducing stripping in accordance with aspects of the present invention.

FIG. 11 depicts an exemplary magnetizable and magnetically actuable fastener that may be used in accordance with a system for preventing or reducing stripping in accordance with aspects of the present invention. Magnetically polarizable sections 1101 and 1103 oppose one another and therefore can be separately electrically or magnetically charged to create a dipole. A corresponding magnetizing unit (not pictured) along with an opposing spinning dipole drive unit (not pictured) can then be used, if the magnetic and/or electrostatic interaction between the drive unit and sections 1101 and 1103 are strong enough relative to the resistance encountered by the anchor section 1105 and a fastened material (not pictured) to overcome it. One or more additional spinning dipole drive units may be used to the side, rather than in a traditional driving configuration for physical contact drivers above the fastener, to physically stabilize the fastener as it is driven into a connected material. To achieve this aspect of the invention, such stabilizing spinning dipoles must spin quickly enough that whatever instantaneous force is exerted on the dipole, it is reversed quickly enough to prevent substantial acceleration of the fastener in any direction that may be undesired, within tolerances preferred for the fastener in the given material. Alternatively, fixed magnets that shadow the movement of the drive head and spinning fastener may stabilize the fastener as it is driven in, but this approach has the disadvantages of larger, and more required, moving parts.

Figure 12:
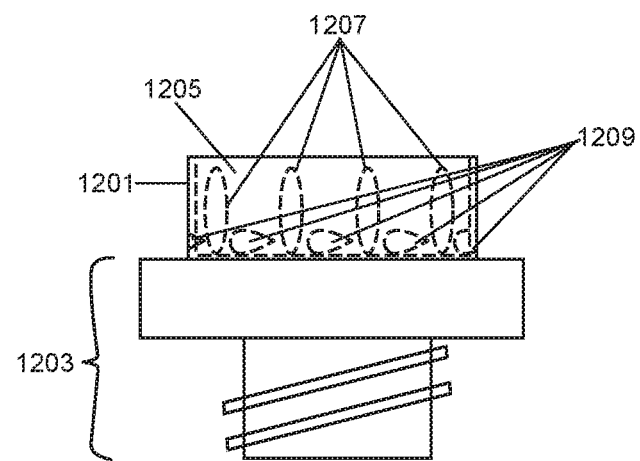
FIG. 12 depicts an exemplary torque or tightness-limited fastener head, for preventing or reducing stripping, in accordance with aspects of the present invention.

FIG. 12 depicts an exemplary torque or tightness-limited fastener head and fastener assembly, for preventing or reducing fastener or fastened material stripping and other damage, in accordance with aspects of the present invention. A torque-limited slipping fastener head 1201 is rotatably conjoined to an anchor section 1203, and anchor projection 1205 bound with but rotatably projecting into the fastener head. Semi-locking curved surface projections 1207 attached to the outer surface of the anchor projection rub against and one-directionally more greatly resist movement ("biased semi-lock") with concentric one-directionally bias semi-locking barbs 1209 along the inner drum surface of fastener head 1201, such that a much greater force may be applied to loosen the fastener than to tighten it. In addition, the amount of torque that may be applied for tightening may be limited to a precise torque that depends upon the project, barb shape and material dynamics, and may be chosen to be below the deformation point of a majority of threading and materials associated with stripping, for particular applications.

Figure 13:
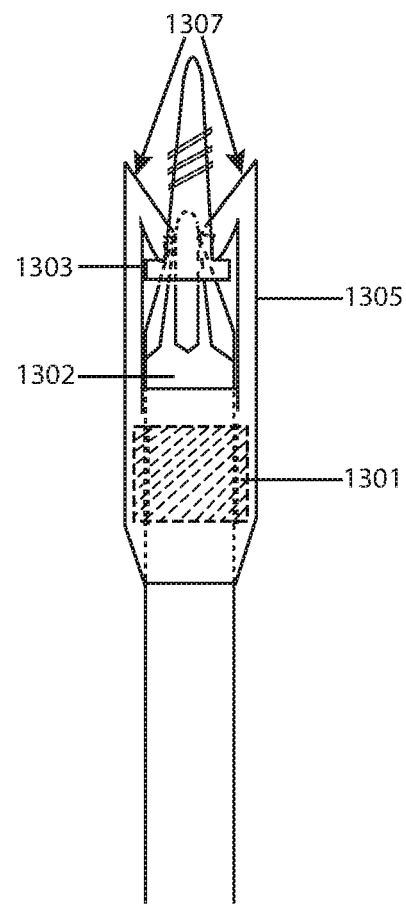
FIG. 13 depicts an exemplary driver tip and specialized band and armature set that may be fastened to the drive head of a fastener driver (also pictured) in accordance with aspects of the present invention.

FIG. 13 depicts an exemplary specialized band and armature set that may be fastened to the driver tip of a fastener driver (partially pictured) in accordance with aspects of the present invention. A coupling band 1301, which is preferably at least partially of a gripping, elastic material, may be slipped over to grip the shaft of a driver tip, such as driver tip 1302. Flexible armatures 1305 are attached to both the coupling band and one another and are non-deformably flexible leaf springs, biased toward the position shown. When properly engaged with a fastener head, grabbing from behind the driver engagement face, as shown, the armatures 1305 naturally pull the fastener head into a properly seated position with the driver tip, allowing one-handed driving, removal and placement of a fastener. Optional curved edges as well as access flanges, which may themselves be curved to allow a ramping initial engagement with the fastener head, or may be flat to allow finger compression of leaf spring sections 1307 to a more flattened position along a plane perpendicular to the driver tip (e.g., against a wall being connected), may allow extending the inner tabs for initial engagement with a fastener embedded in a wall (not pictured).

Figure 14:
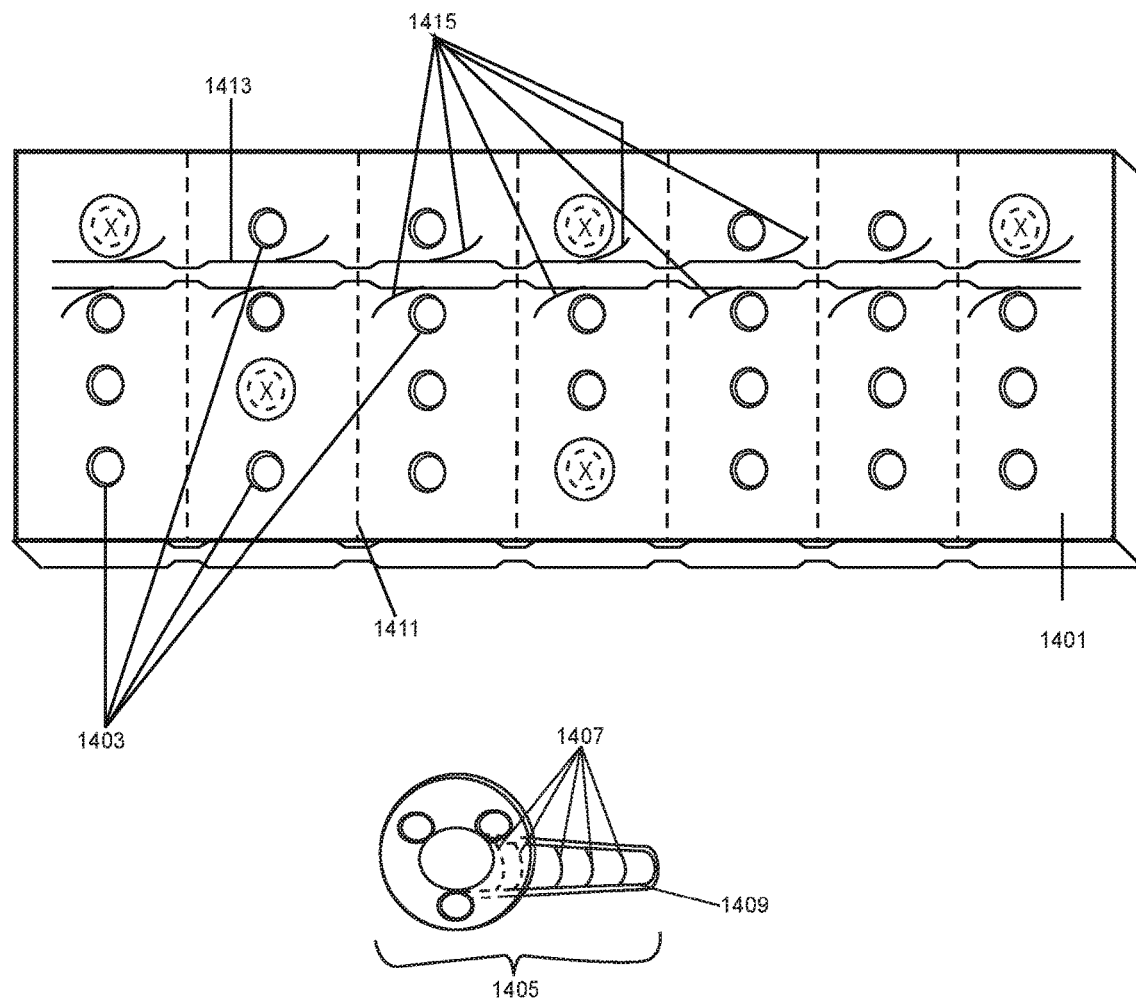
FIG. 14 depicts an intermediary anchoring matrix with selectable matrix anchoring ports and movable, detachable appliance anchoring cups that may be, themselves, anchored into the matrix.

FIG. 14 depicts an intermediary anchoring matrix with movable matrix anchoring ports and movable, detachable appliance anchoring cups that may be, themselves, anchored into the matrix. In this aspect of the present invention, the risk of stripping due to excessive mounting load is specifically addressed with a load-bearing intermediate matrix 1401, with a plurality of available ports, such as ports 1403. A variety of several of such ports may be directly penetrated with any number of fastening elements, such as screws, into a fastened material, such as a plaster wall, which may not be able to hold sufficient weight with just one or two fasteners matching an appliance to be hung, for example, directly into the wall. In addition, any of the ports may be used to mount lockable direct appliance mounting pegs, such as that pictured as 1405. Locking ridges 1407 on such a peg 1405 may allow the locking pegs to strongly interface with intermediate matrix 1401. A drillable or screwable inner lining or entire substance 1409 of the peg may permit a fastener directly interfacing with both the peg and a hung appliance to screw fast and bind more strongly with the peg, than the fastener might if directly placed into the other fastened material (e.g., a wall) through open ports 1403 without pegs 1405. Breakaway scoring 1411 may be included to allow the intermediate matrix to be broken into smaller units, but in the orientation shown such that the weak direction of matrix bending is not in a load-bearing direction. Removable, opposingly scored ribbing 1413, which may be slid into locking ridges such as those shown as 1415 on the matrix, may also be included to temporarily reinforce the matrix in its weak directions of bending.

Figure 15:
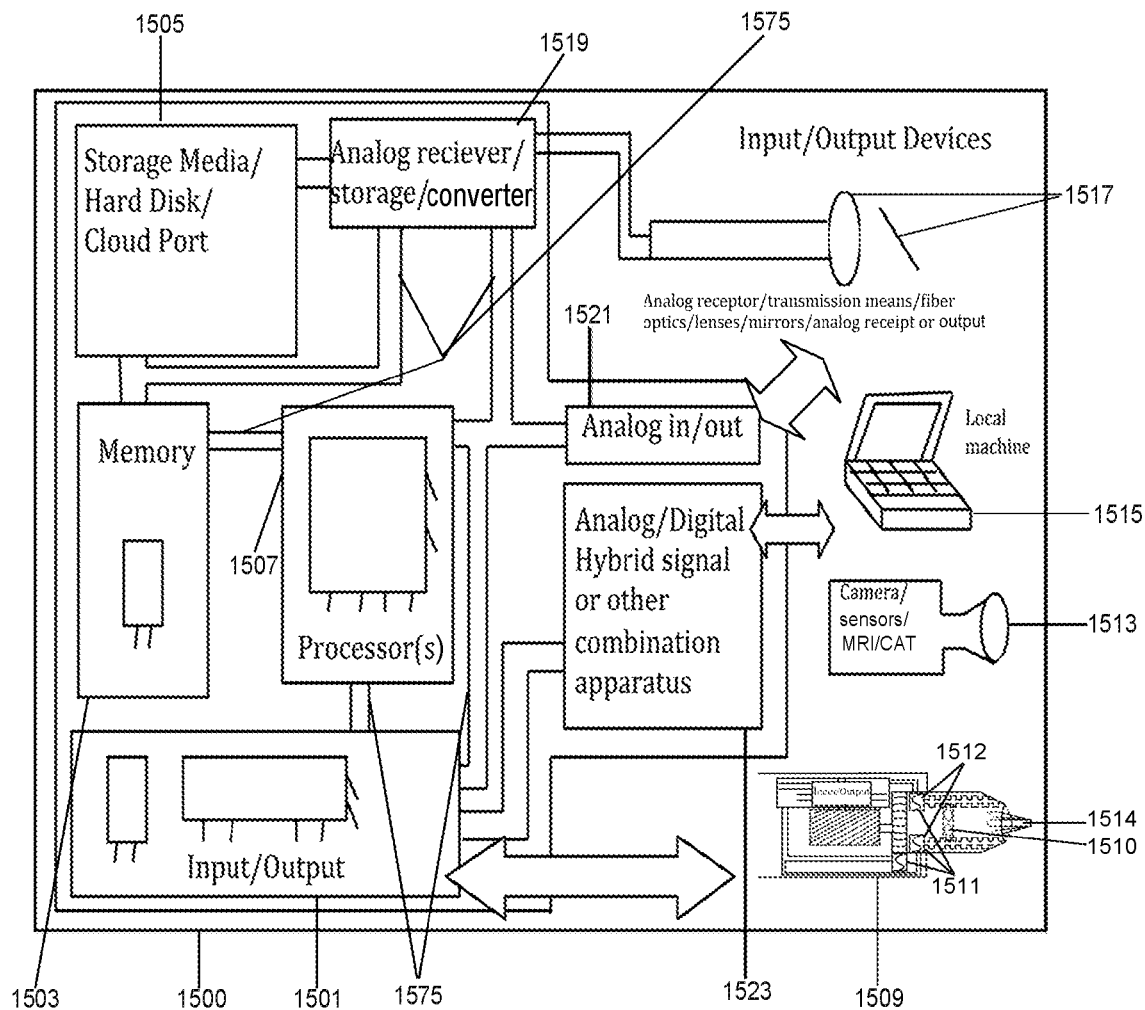
FIG. 15 is a block diagram of some elements of an exemplary system which may be used to manage driving devices and fastener in accordance with aspects of the present invention.
Figure 16:
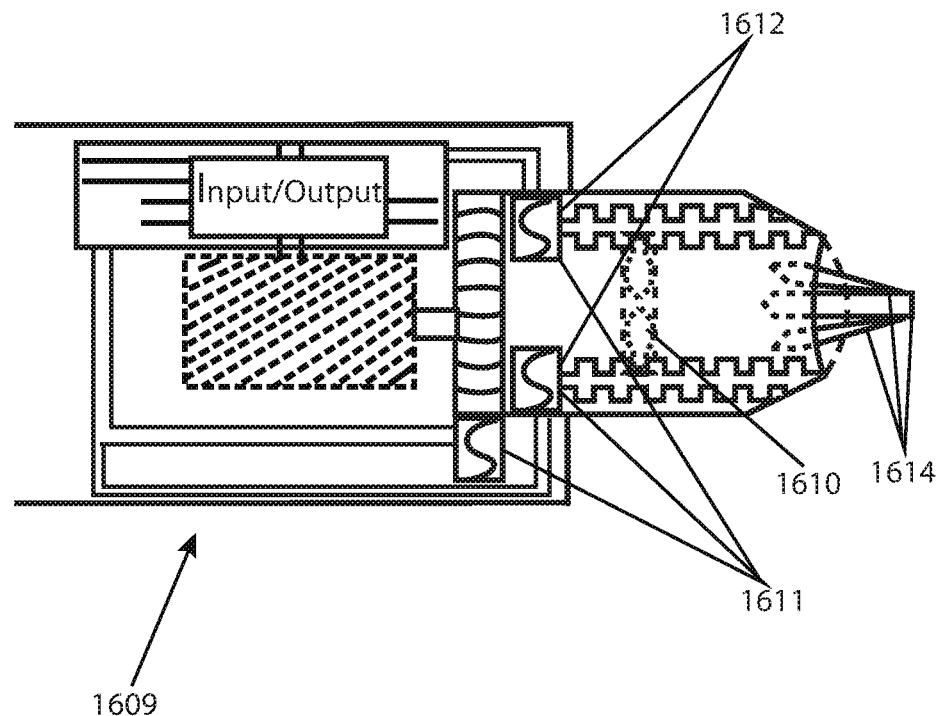
FIG. 16 is a more detailed, larger view of an exemplary mechanical and input/output device of the exemplary system of FIG. 15.

FIG. 15 is a schematic block diagram of some elements of an exemplary system 1500 which may be used to manage driving devices, sensors and fasteners in accordance with aspects of the present invention. The generic and other components and aspects described are not exhaustive of the many different systems and variations, including a number of possible hardware aspects and machine-readable media that might be used, in accordance with the invention. Rather, the system 1500 is described here to make clear how aspects may be implemented. Among other components, the system 1500 includes an input/output device 1501, a memory device 1503, storage media and/or hard disk recorder and/or cloud storage port or connection device 1505, and a processor or processors 1507. The processor(s) 1507 is (are) capable of receiving, interpreting, processing and manipulating signals and executing instructions for further processing and for output, pre-output or storage in and outside of the system. The processor(s) 1507 may be general or multipurpose, single- or multi-threaded, and may have a single core or several processor cores, including microprocessors. Among other things, the processor is capable of processing signals and instructions for the input/output device 1501, analog receiver/storage/converter device 1519, and/or analog in/out device 1521, to cause sensor/motors 1511 (also shown as 1611 of expanded view FIG. 16) in a fastener driving device 1509 (also 1609) to actuate or give or receive signals and take actions, or to cause a user interface to be provided for use by a user on hardware, such as a personal computer monitor or terminal monitor with hardware input devices and presentation and input software (as in a GUI). For example, a distance measuring sensor/motor array 1512 (also 1612) may indicate a distance measurement of a distance measuring member, such as member 203 from FIG. 2, held by grabbing device 1510 (also 1610) at grabbing point 207, to determine distances associated with properly seated positions of a drive head held by pincers 1514 (also 1614). The processor(s) 1507 is/are capable of processing instructions stored in memory devices 1505 and/or 1503 (or ROM or RAM), and may communicate via system buses 1575. Input/output device 1501 is capable of input/output operations for the system, and may include innumerable input and/or output hardware, such as a computer mouse, keyboard, networked or connected second computer, camera or scanner, mixing board, reel-to-reel tape recorder, external hard disk recorder, additional movie and/or sound editing system or gear, speakers, external filter, amp, preamp, equalizer, computer display screen or touch screen. It is understood that the output of the system may be in any perception form. Such a display device or unit and other input/output devices could implement a user interface created by machine-readable means, such as software, permitting the user to carry out the user settings, programming steps and input discussed in this application. 1501, 1503, 1505, 1507, 1519, 1521 and 1523 are connected and able to communicate communications, transmissions and instructions via system busses 1575. Storage media and/or hard disk recorder and/or cloud storage port or connection device 1505 is capable of providing mass storage for the system, and may be a computer-readable medium, may be a connected mass storage device (e.g., flash drive or other drive connected to a U.S.B. port or Wi-Fi) may use back-end (with or without middle-ware) or cloud storage over a network (e.g., the internet) as either a memory backup for an internal mass storage device or as a primary memory storage means, or may simply be an internal mass storage device, such as a computer hard drive or optical drive. Generally speaking, the system may be implemented as a client/server arrangement, where features of the invention are performed on a remote server, networked to the client and made a client and server by software on both the client computer and server computer.

Input and output devices may deliver their input and receive output by any known means, including, but not limited to, the examples shown as 1509, 1513, 1515, and 1517.

While the illustrated system example 1500 may be helpful to understand the implementation of aspects of the invention, it is understood that any form of computer system may be used—for example, a simpler computer system containing just a processor for executing instructions from a memory or transmission source. The aspects or features set forth may be implemented with, and in any combination of, digital electronic circuitry, hardware, software, firmware, or in analog or direct (such as light-based or analog electronic or magnetic or direct transmission, without translation and the attendant degradation, of the image medium) circuitry or associational storage and transmission, as occurs in an organic brain of a living animal, any of which may be aided with external detail or aspect enhancing media from external hardware and software, optionally, by networked connection, such as by LAN, WAN or the many connections forming the internet. The system can be embodied in a tangibly-stored computer program, as by a machine-readable medium and propagated signal, for execution by a programmable processor. The method steps of the embodiments of the present invention may be performed by such a programmable processor, executing a program of instructions, operating on input and output, and generating output. A computer program includes instructions for a computer to carry out a particular activity to bring about a particular result, and may be written in any programming language, including compiled and uncompiled and interpreted languages and machine language, and can be deployed in any form, including a complete program, module, component, subroutine, or other suitable routine for a computer program.

In addition to the multi-staged, self-tightening, signaling, and system-controlling damage avoidance and remediation techniques discussed above, additional materials approaches are within the scope of aspects of the invention. For instance, a continuous cord of flexible material (such as plastics typically used in "zip ties"), with periodic compressible central ports through which the cord itself may be passed, and which have zip-tie-type one-way inner ridges, allow a single spool of such a cord, with complementary, opposing one-way zip-tie type outer ridges to provide unlimited wrap-around connector lengths to be used. Although the ports appear donut-shaped with connecting cord lengths, their compressibility allows them to pass through the center of another port when that cord is bound to itself, creating a tightenable loop, and the ring-like ports expand again, due to their flexibility, once passed through the inside of another port, providing extra fortification against untightening once through another port. Such a variable-length continuous cord avoids much of the expense and difficulty of otherwise avoiding stripping and other tightening damage, and is highly versatile.

Additional driver-head enhancements to avoid damage due to driver tip cam-out and lateral slipping are also within the scope of the present invention. Especially in the context of driver tip and fastener heads without inherent centering (such as with "flat-head" screws, there is an increased risk of lateral slippage of the drive head out of the fastener head. A series of surrounding, progressively-larger telescoping sockets that are individually or progressively spring loaded lightly enough not to cause damage to an attached, target material for a driven fastener may be individually actuable, with smaller, inner surrounding sockets moving upward when encountering a surface (such as the head of a screw or a wall) without causing wider, outer-more socket barrels to move with the nudging of the inner-more socket barrels. In this way, the next larger-sized socket barrel, which will surround the outer side edge of a fastener head, and prevent drive head lateral slippage regardless of whether it also assists in engaging the fastener head for gripping, will automatically become selected and surround the fastener head. A transparent series of such sockets is preferred, to aid in aligning seating, as is a notch/groove series relation of larger-to smaller barrels causing larger barrels, when actuated, to actuate all barrels below its size in a proximal direction, but not vice versa. This may be accomplished by notches in the inner-more barrels with tabs from the outer-more barrels that abut the proximal end of the notch of the next barrel inward, but with enough length of notch that when inner barrels are compressed, the outer tabs simply travel within the notch, and all barrels are spring-loaded distally, preferably, with a single spring. A surrounding housing for protection and rounded and/or elastomeric barrel/distal surface interaction is also preferred.

Figure 17:
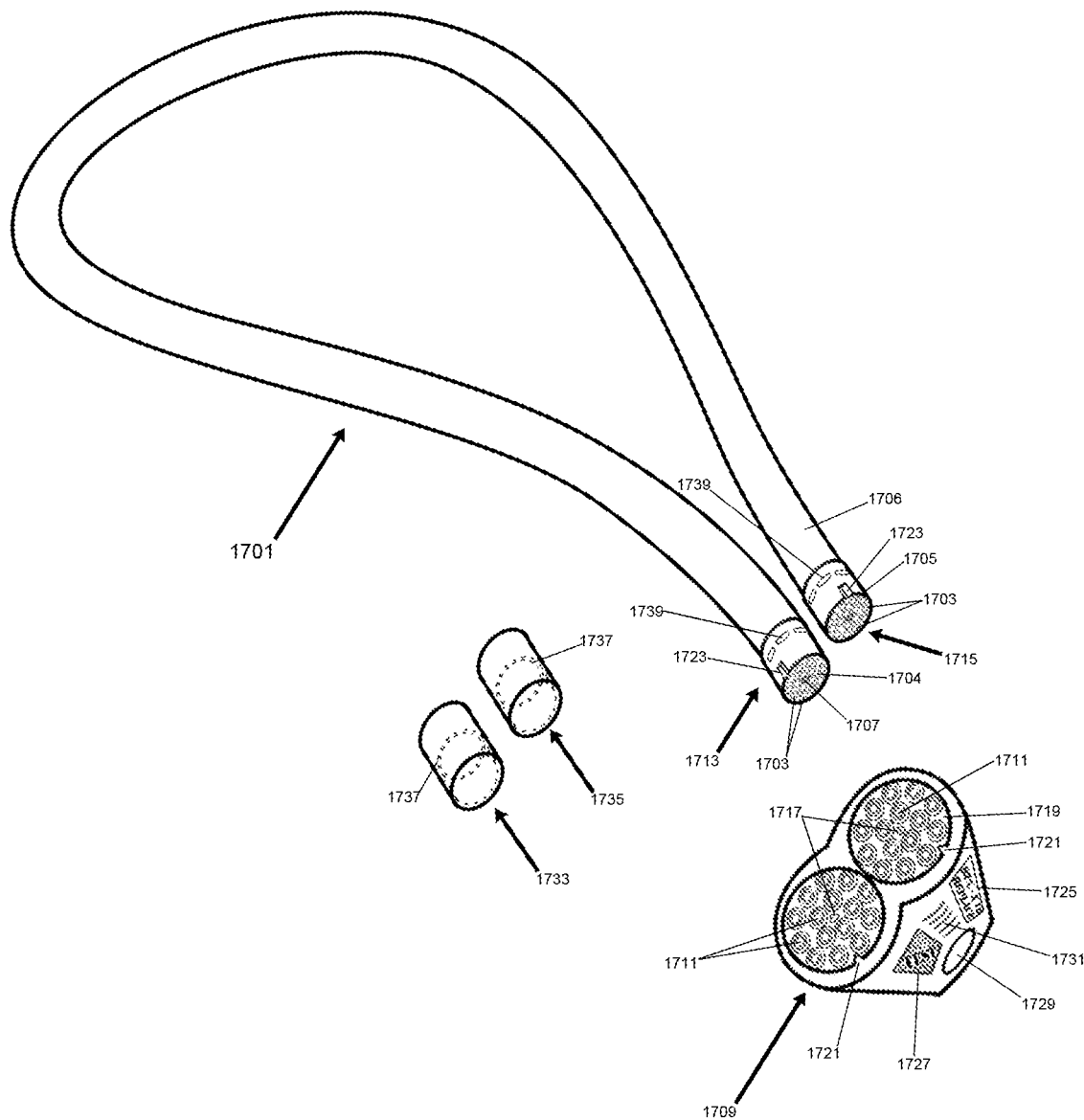
FIG. 17 is a perspective drawing of exemplary aspects of a new type of system-testable cord connector, and exemplary aspects of auxiliary hardware for testing and storing such a cord connector.

FIG. 17 is a perspective drawing of exemplary aspects of a new type of system-testable cord/connector 1701, and exemplary aspects of auxiliary hardware for testing and storing such a cord connector. As with conventional ropes, cord 1701 is a flexible length of material that can be used for any activity or task involving binding or suspending objects and living things (e.g., holding objects and persons in rock climbing or suspension bridges). Unlike conventional cords and ropes, however, cord 1701 comprises a set of independently testable fibers, such as the examples pictured as 1703, each extending lengthwise throughout cord 1701, and each with a tensile strength contributing to the overall strength of cord 1701 as a flexible connector. In some embodiments, each testable fiber 1703 may be independently testable. To accomplish this, the material comprised in each fiber 1703 (which may, itself, be comprised of several fibers, interwoven or otherwise arranged) may comprise a material with a galvanic resistance measurably related to its physical integrity. For example, as interwoven subcomponents of each fiber 1703 break down, the galvanic resistance of them will increase due to lower conductivity, while, at the same time, the strength of those subcomponents will also decrease. Examples of testable materials include flexible conductive metals, graphene, nylon and other textiles impregnated or doped with conductive materials, or fiber optics (testable for integrity by the passage of light). In some embodiments, separate subcomponents, Material A and Material B, comprising at least two different materials, of each fiber 1703, Material A being testable for structural integrity via resistance, light or other phenomenon passage through it and closely integrated with or otherwise associated with Material B, comprising load-bearing structural components for providing the tensile strength of the cord. In some embodiments, Material A comprises a weaker material, with greater fragility and tightness, more distally located (toward the surface of the cord) and with less flexibility than Material B (or having any of these property differences). In this way, the tested material is much more likely to break first, and being tested will register positive for a breakdown in integrity of fiber 1703, before or at least immediately upon the breakdown of the load-bearing material (B) of fiber 1703. To aid in individually testing the integrity of each fiber 1703, an insulator, such as the example pictured as 1705, may be provided, encapsulating and separating each fiber 1703 from one another. In this way, contacts for passing current or other testing phenomena through each fiber 1703 can be separately applied to each fiber 1703, as will be explained in greater detail below. However, it is preferred that such insulation and each fiber 1703 be tightly fastened, locked and interconnected with a strong internal adhesive material 1704 (stronger and less flexible than any of the other fibers within cord 1701) to every other component of cord 1701, such that neither the insulation of each fiber 1703 nor an outer surface material 1706 is able to slide or shift relative to any other component. In this way, the interstitial adhesive material 1705 ensures that each component of cord 1701 contributes to a load borne by cord 1701, and provides an additional, back-up load-bearing structure for a user, if any or all of fibers 1703 become compromised by a load or event sufficient enough to do so, but insufficient to compromise the greater strength of the adhesive material. Thus, a cord 1701 may still be serviceable, adding an increased safety margin, while reporting cord 1701 as compromised in testing, as discussed further below. Preferably, the strength of the adhesive material alone is sufficient to rate the cord as safe for any intended use, to provide this safety margin. In addition, a central, namely, core element 1707, with a greater strength by itself than needed for an anticipated use of cord 1701, is also provided. Central core 1707 can comprise very strong, flexible materials, such as steel cable, carbon fiber or graphene. In some embodiments, central core 1707 is independently testable for integrity but, in other embodiments, central core 1707 is untested, due to a safe assumption that it will remain sufficiently strong if other components test as safe.

To test the integrity of each fiber 1703, and, in some embodiments, other components, of cord 1701, and externally-applied testing unit 1709 is provided. It should be noted that unit 1709 is pictured as closer to the viewer than cord 1701, to aid in seeing its features, but it is actually of a complementary size to fit exactly over the ends of cord 1701 snugly. External testing unit 1709 may comprise and/or be connected and able to communicate with a control system, such as control system 1500 provided in FIG. 15, infra—for example, with a U.S.B. cable or other connection and communication techniques known in the art. As such, unit 1709 may comprise battery(ies) for power and/or external power source(s), such as a power adapter connectable to a wall outlet, or photovoltaic or other ambient power converters, to run the processes set forth in reference to FIG. 18 related to testing the integrity of fibers and other subcomponents of cord 1701.

Among other features, testing unit 1709 comprises an array of separately-chargeable contacts, such as the examples pictured as 1711, arranged in a pattern such that each contact 1711 corresponds with the position of the end of a fiber 1703, exposed at the ends 1713 and 1715 of cord 1701. In addition, two central, bladed contacts 1717 corresponds with the position of the cross-cut central core element 1707, in some embodiments. Thus, to test the integrity of each fiber and component of cord 1701, a user may apply testing unit 1709 to the ends of cord 1701 by pressing contacts 1711 against each exposed end of each fiber 1703. A pressure sensor, for example, on plate 1719 encompassing contacts 1711, may indicate that a user has attempted to so press unit 1709 and ends 1713 and 1715 together, for testing. To avoid errors by ensuring a proper alignment of contacts 1711 with the ends of fibers 1703, keys 1721 within the mating area of unit 1709, slidingly engage with guidance slots 1723 of ends 1713 and 1715, ensuring that alignment when coupling unit 1709 with ends 1713 and 1715 for the testing described herein. If an improper alignment or other improper coupling is, nonetheless, detected by the control system comprised in or comprising unit 1709, unit 1709 may report that improper alignment on an external display or other GUI, such as external display 1725. To power on, or initiate testing using unit 1709, user-actuable button 1727 labeled "TEST" is also provided. Use of these features is discussed in greater detail, below, in reference to FIG. 18. Each fiber 1703 is tested by unit 1709 by applying a positive and negative voltage, respectively, through the pair of contacts corresponding to and aligning with the ends of a given fiber 1703. Thus, unit 1709 can apply a voltage and current through each fiber 1703, individually, and, based on the amount of current or resistance measured, assess whether the physical integrity of each fiber 1703 has changed over time (or in comparison to a normal or expected resistance for a given cord 1701 and its reported, optimal characteristics, which may be user-entered or automatically assessed by cord-identification upon coupling of unit 1709 with cord 1701.) For example, the cord may have a signature resistance or serial/model number and length readable by unit 1709 upon coupling, and unit 1709 may have or have access to a library of normal or expected optimal resistance or other measured characteristics for the cord. In some embodiments, cord 1701 may have a readable or other directly-passable data encapsulating the normal/expected resistance for each fiber, rather than bothering with model and unit numbers and other intermediate steps. Unit 1709 preferably has a small profile, and is light and portable, such that it may be used in camping and other outdoor activities. To enhance its portability, a keychain or carabineer port 1729 may be provided. To ease coupling and pressing unit 1709 against the ends 1713 and 1715, a thumb-grip 1731, may also be provided.

To protect the ends 1713 and 1715 when not under testing, end caps 1733 and 1735 are also provided. In some embodiments, end caps 1733 and 1735 fasten tightly to ends 1713 and 1715 with the aid of internal ridges 1737, which snap into and hold complementary locking ridges 1739, on the exterior circumference of ends 1713 and 1715.

Figure 18:
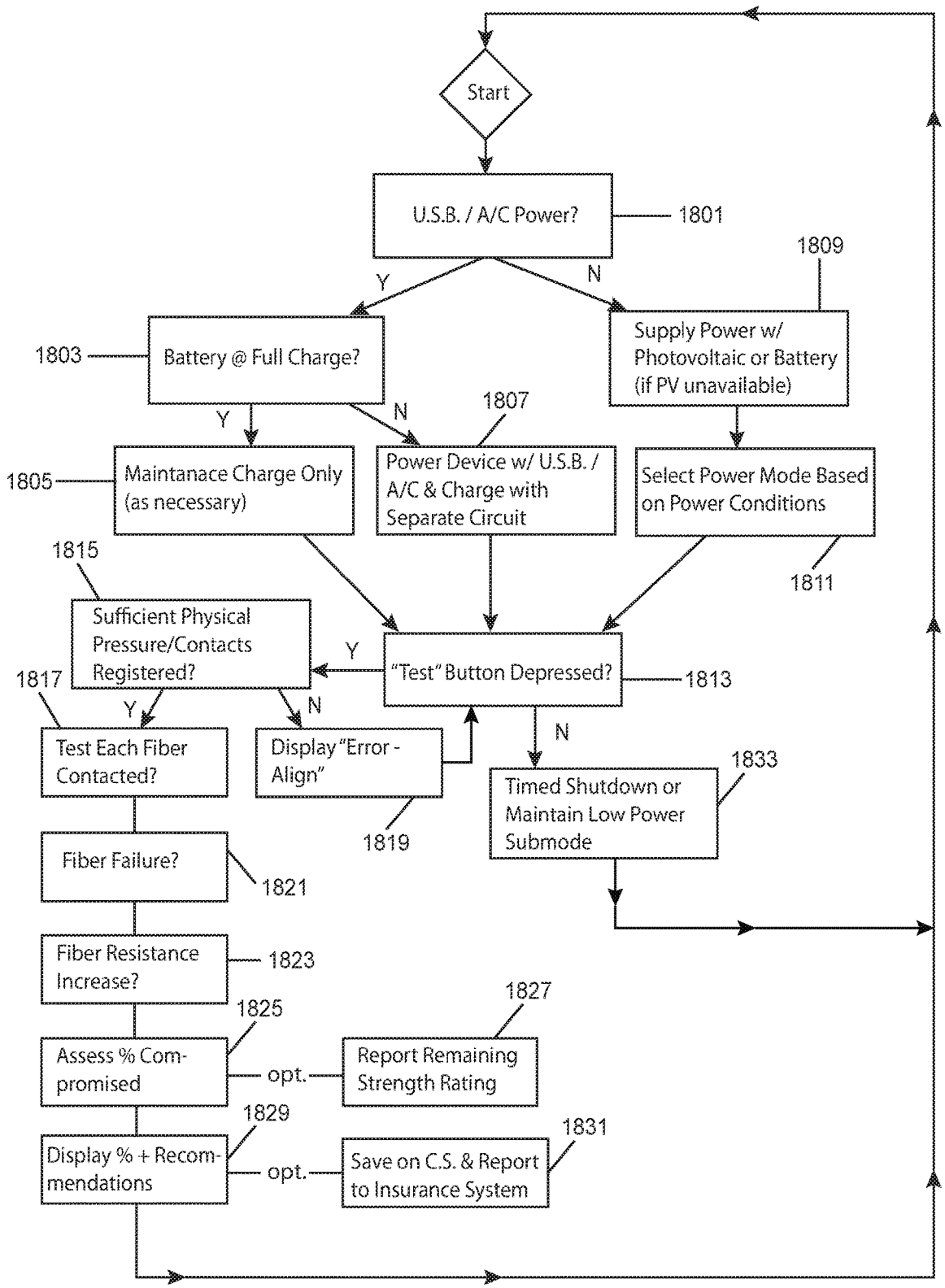
FIG. 18 is a chart describing exemplary steps for a control system to diagnose conditions of a testable cord connector, such as the cord connector set forth above in reference to FIG. 17, and to prevent and report risks associated with those conditions.

FIG. 18 is a chart describing exemplary steps for a control system to diagnose conditions of a testable cord connector, such as the cord 1701, set forth above in reference to FIG. 17, and to prevent and report risks associated with those conditions. As explained above, these steps are carried out using a testing unit, such as testing unit 1709, which may comprise or be comprised in a control system. An exemplary control system is set forth above, for example, in reference to FIG. 15.

Beginning with step 1801, the control system first determines whether the testing unit has access to a sufficient external power source (e.g., from a U.S.B. cable, conventional A/C power cord) for powering the remaining operations set forth in reference to this figure. If so, the control system proceeds to step 1803, where it assesses whether a battery within the testing unit is fully charged (to its full recommended capacity of electrochemical energy). If so, the control system next proceeds to step 1805, in which it enters a mode for maintaining/restoring that optimal charge, if the on-board batter falls below it. If, at step 1803, the control system determines that the battery is not sufficiently charged, it proceeds to step 1807, in which it accesses external power sources to run its operations, preferably while charging the battery with an independent, charging circuit. If, at step 1801, the control system determined that an external power source is not available, it may proceed to step 1809, in which it uses accesses power from a photovoltaic array, if available or, if not, from the local battery/capacitor(s)/other power storage. Depending on the availability of such power storages or sources, the control unit enters a corresponding power mode utilizing the available source(s), at step 1811.

In any event, after settling these power source issues as set forth above, the control system next proceeds to step 1813, in which it determines whether a user has depressed the button within a GUI of the testing unit labeled for initiating usage, or "TEST," as set forth above. If a user has pressed the TEST button, indicating a desire to test a cord coupled with the testing unit, as discussed above, the control system next proceeds to step 1815, in which it determines whether the contacts for testing fibers 1703 have been pressed together with the ends of the cord tested to a sufficient degree of pressure to maintain electrical or other testing contact, and effectuating testing (e.g. with a pressure-sensitive plate, and separately system-addressable resistance sensors connected with each separately electrically system powerable contact 1711). If so, the next separately tests each set of contacts corresponding with each separately-testable fiber of cord 1701, as discussed above, in step 1817, for example, by applying a voltage through it to complete a circuit (if possible) and assessing the level of current or resistance. If, in step 1815, sufficient pressure or alignment of the contacts with the ends of each fiber has not occurred, the control system may deliver an error message to the user, in step 1819, and return to step 1813. If proper pressure and alignment has occurred, but no current appears to pass through a particular fiber tested, the control system assesses and may report a total fiber failure, in step 1821. If a total fiber failure has not occurred, any increased resistance in the fiber associated with compromised integrity may be sensed and recorded, in step 1823. That increase may be assessed, as discussed above, relative to a norm for a given cord type, or based on past history with the cord or manual entry of optimal resistance. Also, as discussed above, in some embodiments, other tests, such as light-carrying with optical fibers, may instead or in addition, be used to assess cord component integrity associated with the cord's continued safety in carrying particular loads. For example, in step 1825, the control system may assess a percentage by which the fiber is determined to have its load carrying capabilities compromised, based on an associated resistance curve corresponding with cord strengths. The control system may then record and/or report that percentage as a remaining strength rating, in optional step 1827. That total or partial fiber compromise assessed in steps 1821 to 1825 may then be applied by the control system in a larger algorithm, combining and weighting the test results from all of the other tested cord components, rendering an overall recommendation regarding whether the cord is safe to continue using, or should be retired, and/or its current strength rating (e.g., ability to support X pounds), in step 1829. In some embodiments, a user's liability insurance coverage for related hazardous activities may be keyed on the results of cord testing. In those embodiments, the control system may record and report the results of the cord test externally (e.g., to an insurance company's internet server) in optional step 1831. Rates and coverages can then be keyed on that recorded data.

If, in step 1813, the user has not initiated testing, the control system may shutdown after a given amount of time passes, or maintain a low power mode, until such testing is initiated, or changes to the power supply occur, in step 1833. The control system then returns to the starting position.

It should be understood that, although several internal fibers and other testable components of a tested cord are provided and tested in the embodiment above, in some embodiments, more, or fewer such fibers or components may be used. In some embodiments, a single internal testable material of the tested cord, the resistance of which varies with wear and strength and integrity loss, may be tested by the control system and assessed with results displayed as set forth above.

In some methods and embodiments of the present invention, a user may "save" an existing cord that tests insufficiently strong by locating an area of compromised integrity within the cord. In these methods and embodiments, the testing unit may sense, estimate and report the location of increased compromise by echolocation (the distance to a point, e.g., of traveling and rebounded light on a fiber optic channel within the cord). Alternatively, a user can assess the location by trimming off lengths of the cord, and retesting the newly-exposed cord ends, until the control system reports a desired improvement in cord integrity (e.g., increased strength rating.)

Figure 19:
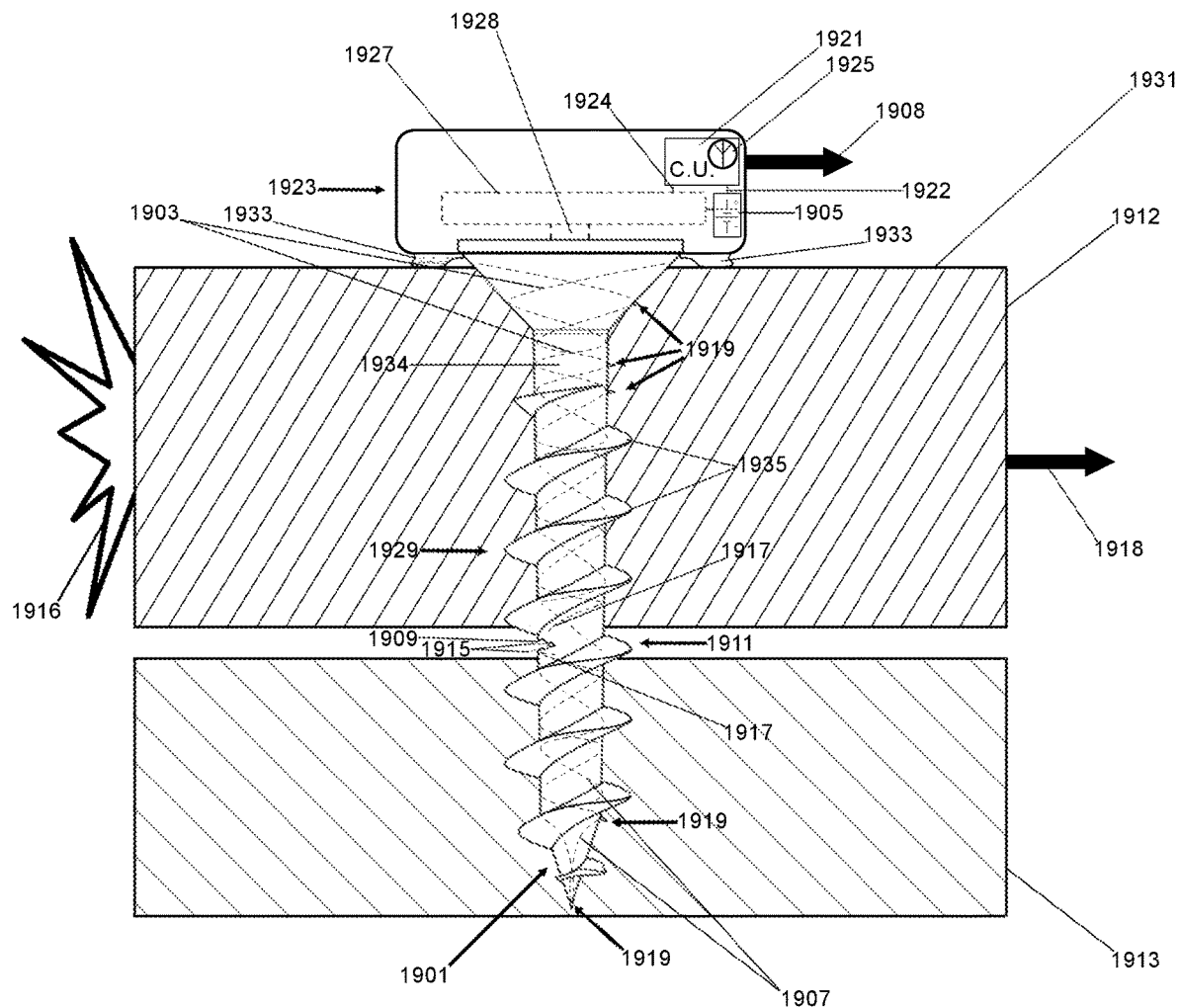
FIG. 19 is a side view of an example self-tightening fastener, of a new type configured to be remotely managed, by monitoring tightness and other conditions, and remotely driven, as part of a fastening system including a control system, according to some embodiments.

FIG. 19 is a side view of an example self-tightening fastener 1901, of a new type configured to be remotely managed, by monitoring tightness and other conditions, and remotely driven, as part of a fastening system including a control system, according to some embodiments. In some embodiments, such a control system may be as provided above, in reference to FIGS. 15 and 16, for example.

To aid in monitoring tightness and other conditions related to fastener 1901, fastener 1901 includes at least partially internal, monitorable magnetic materials, such as example magnetizable array 1903 of conductive, charge-carrying forms. In some embodiments, magnetizable array 1903 is configured to transport electricity throughout electricity-conducting sub-elements (e.g., from a battery, capacitor or other electrical energy storage device 1905). In some embodiments, such electricity-conducting elements may include one or more brittle wires 1907, configured to break or otherwise alter their magnetic characteristics under strain, and/or permanent deformation. Array 1903 may take on a wide variety of alternative forms, in various embodiments, but, ideally, includes form(s) that alter their magnetic signature more greatly under slight structural alterations (e.g., deformation from fastener breakage). Thus, for example, if self-tightening fastener 1901 experiences sheering force (e.g., in a lateral direction as shown by force-depicting arrow 1908), breaking at least part of self-tightening fastener 1901 (e.g., at a breakage point 1909 at or about a junction area 1911 between materials, e.g., example upper material 1912 and example lower material 1913, which self-tightening fastener 1901 is inserted into and joins together), some of the brittle wires are fractured, as shown for example fractured brittle wires 1915. In addition, as shown by example bent and spread-apart brittle wires 1917, some of brittle wires 1907 are structurally deformed, without completely fracturing. Whether brittle wires 1907 are fractured or otherwise deformed, as discussed above, the magnetic field surrounding the magnetizable array 1903 is thereby altered, and a remote sensor can sense the alteration of the magnetic field. As another example, in some aspects of the invention, a lateral shearing or other fastener-breaking force might be applied to a material in which self-tightening fastener 1901 is inserted, such as example collision 1916 into upper material 1912, as shown by example force-depicting arrow 1918. Any such shearing or other breakage force might result from any known force experienced in the art, including shocks, vibrations, hammering and collisions, such as the example collision In some embodiments, the magnetic field can extend outward from self-tightening fastener 1901, e.g., in embodiments where brittle wires extend beyond, or connect to conductive materials outside of, the exterior surface of self-tightening fastener 1901. For example, in some embodiments, exposed tips, such as the example exposed tips 1919, of magnetizable array 1903 (e.g., connected to brittle wires 1907) may contact, penetrate and or send current through conductive materials within example upper material 1911 and/or example lower material 1913 in which self-tightening fastener 1901 is inserted. In some embodiments, exposed tips 1919 may be pointed and/or curved to meet each other, bridging current through each other, changing the monitorable magnetic signature of magnetizable array 1903. A magnetic signature is any alteration in the magnetic field generated by the magnetizable array, when magnetized in a particular way. In some embodiments, such a particular way of magnetizing the magnetizable array may be passing an electrical current through the conductive sub-elements of the magnetizable array (e.g., the brittle wires 1907) with a particular amount, or by applying a particular amount of voltage to at least some of them. If, upon passing that same current, or applying the same voltage, at two different times, to those same sub-elements, and measuring aspects of the resulting magnetic field at each of those times, a user, or control system, may make a determination that the magnetic field (and the magnetic signature) of the magnetizable array has been altered, and further determine that a condition of the brittle wires (and the fastener itself in which it is included) has been altered. Such measurements of magnetic fields may be made by any method known in the art (e.g. Hall Effect probe), but remote measuring apparatuses are preferred, especially where fasteners may be inaccessible, e.g., within a machine, building or other structure.

Furthermore, in some embodiments, the control system of the fastening system may store models of magnetic signatures for the self-tightening fastener. Some such models may relate to ranges of magnetic force, and direction of magnetic force, at predetermined locations and positions relative to the self-tightening fastener 1901, associated with particular conditions of fastener 1901. For example, where the self-tightening fastener is more greatly tightened against a surrounding material (such as example upper material 1911 and/or example lower material 1913), resulting in greater strain, the position of brittle wires 1907 may become stretched and twisted in spiral, in reaction to the lengthening (stretching) and twisting of the fastener, resulting in one type of change to the resulting magnetic signature. If, by contrast, any of the exposed tips 1919 are connected, or disconnected from a surrounding, conductive material (e.g. due to part of the material disconnecting, or breaking away) it will resulting in a different type of change to the resulting magnetic signature. As another example, if any of the brittle wires have broken, at particular points, such breakage will result in a yet another, different type of change to the resulting magnetic signature. In some embodiments, the control system of the fastening system may maintain and update a library of magnetic signatures, and ranges and characteristics thereof, associated with such conditions of the brittle wires and the self-tightening fastener, and record and report such conditions (e.g., via a warning or other GUI aspect) to a user if a sensed magnetic signature matches such a model (e.g., within a range of expected magnetic field values, or closely matching such values, such as by a degree of confidence or confidence interval), such that the user can address and remediate the condition, if needed.

In some embodiments, an on-board control system 1921 may also, or alternatively, be provided (e.g., in, on or about a head section 1923, of self-tightening fastener 1901, in some embodiments). Such a control system may be such as, or similar to, other control systems set forth in the present application, for example, in reference to FIG. 15, above. In some embodiments, such an on-board control system may include, or be connected (e.g., via example electrical power and communications connection 1922) a dedicated or shared, on-board power source, such as battery, capacitor or other electrical energy storage device 1905 (also used for sending current through magnetizable array 1903). In some embodiments, on-board control system 1921 may communicate with, control, and/or be controlled by, an external, remote control system, such as any of the control systems set forth in this application, e.g., via wireless antenna 1925. On-board control system 1921 may also include, or be connected with (e.g., via example electrical power and communications connection 1924), and capable of communicating with and powering, a fastener-tightening motor 1927. In some embodiments, fastener-tightening motor 1927 is connected to a central shaft 1928 (e.g., integral with a lower fastener section 1929) which is rotatably mounted within head section 1923. Head section 1923, in turn, is mountable onto an upper exterior surface 1931 of a material, such as example upper material 1912, which self-tightening fastener 1901 has penetrated, in the example pictured. By driving the rotation of central shaft 1928, and lower fastener section 1929 with fastener-tightening motor 1927, the control system can adjust the tightness of self-tightening fastener 1901 in a material in which it has been embedded. To aid in applying that force (e.g., in a clockwise, rotational direction), counter-rotation checking gripping features 1933 may be included, in some embodiments. In some embodiments, counter-rotation checking gripping features may include barbs and/or edges facing the material in which self-tightening fastener may be embedded (e.g., upper material 1912), and also facing in a direction at an angle at least partially opposing a loosening rotational direction of self-tightening fastener 1901. In other words, in the example pictured, self-tightening fastener 1901 more deeply penetrates upper material 1912 and lower material 1913 by powering fastener-tightening motor 1927, driving central shaft 1928 in a clockwise direction (from a perspective facing the top of head section 1923). Friction and/or stiction between head section 1923, in which fastener-tightening motor 1927 is mounted, and upper material 1912 provides normal forces, and a platform from which to drive that clockwise rotational force, screwing lower section 1929 deeper into the materials, tightening self-tightening fastener 1901. To increase that friction and/or stiction, counter-rotation checking gripping features 1933 point in down into the upper exterior surface 1931 at an angle resisting counterclockwise rotation of head section 1923. Of course, in various other embodiments, with other rotational or even linear or curved (e.g., axial) directions of tightening, such friction and gripping features would be provided to oppose those other directions of movement and tightening, of at least part of the fastener. In some embodiments, the on-board control system 1921 may be configured to reverse the direction of fastener-tightening motor 1927, thereby loosening the self-tightening fastener 1901. Thus, self-tightening fastener 1901 can both tighten and loosen itself, depending on whether the magnetic signature (discussed above) of the self-tightening fastener or a sub-component thereof, indicates a less than optimal tightness (tighter than or looser than a particular pre-set tolerance for the fastener). In some embodiments, motor 1927 may include a pre-wound spring. In some embodiments, motor 1927 may include an electric motor. In some embodiments, fastener-tightening motor 1927 may include internal gearing to provide mechanical advantage.

In some embodiments, the on-board control system 1921 may perform the modeling, magnetic signature and other assessments and determinations set forth above for other control systems. In some such embodiments, the on-board control system 1921 may control an external control system. However, in some embodiments, such an external control system may control the on-board control system 1921.

In some embodiments, remote monitoring of fastener(s) (such as example self-tightening fastener 1901) may be carried out (e.g, by a control system of the fastening system remote from the fastener(s). In some such embodiments, such remote monitoring includes testing a magnetic signature of the fastener and/or structural material (e.g., via remote scanning and/or testing, using a magnetic sensor located on that control system). In some such embodiments, that control system may identify each such fastener(s), and its location within a material and/or structure in which it is held, by at least part of their magnetic signature (e.g., a magnetic field resulting from at least part of the magnetizable array at a particular position relative to the fastener, and with a magnetic force measured in a particular direction at that position). Thus, if an adverse condition, such as a fracture and/or bending, and/or an associate decrease in tightness (e.g., decreased torque applied) of the fastener in a material is sensed, the control system may then issue an alert to a user (e.g., via a GUI of the control system) and/or cause the fastener to remediate the adverse condition. For example, in some embodiments, such a control system sends a command, via a wireless signal, to an on-board control system of the fastener (e.g., via wireless antenna 1925), to apply additional tightening force (e.g., via fastener-tightening motor 1927). However, in some embodiments, any of the above monitoring, and such remedial actions, may also, or alternatively, be carried out by the on-board control system, rather than a remote control system. In some embodiments, where fasteners such as self-tightening fastener 1901, are provided, except that self-tightening motors or other actuators on-board the fastener are omitted, such an alert may instruct a user (e.g., via such a GUI) to access and remediate the adverse condition (e.g., by manually tightening, reinforcing, or replacing the fastener or materials in which it is embedded). In some embodiments, such actuators on board the fastener may include any known, suitable actuator in the art. And, in some embodiments, remedial actions for addressing sensed adverse conditions (such as fastener breakage, bending, loosening, and other known adverse conditions of fasteners) may include remedial actions other than tightening. For example, in some embodiments, such an on-board actuator may be a pump, directing a healing fluid onto, or into, part of a fastener. For example, in some embodiments, magnetizable array 1903 may include hollow tubes connected to such a pump, and such a pump may inject a healing fluid, such as a conductive glue, into the magnetizable array, to restore a breakage in the magnetizable array, altering its magnetic signature. As another example, in some embodiments tips 1919 may include ports connected to such hollow tubes, and such a pump may release such a glue into a hole in which the fastener is driven.

In some embodiments, an adverse condition of the fastener may, as discussed above, include a loosening of the fastener. For example, in some embodiments, a sensor on-board the fastener may determine a torque required to further tighten the fastener into the material(s) in which it is embedded, at different points in time (e.g., at time intervals). In some embodiments, a control system (such as any of the control systems above) connected for communications with such a sensor is also communicatively connected with such a motor, and periodically applies a plurality of different torques, increasing the amount until the fastener is sensed to move (e.g. via a motion sensor). Thus, the control may determine, based a decrease in driving power necessary to tighten said at least one of the fasteners, that the tightness of the fastener has decreased. In some embodiments, however, such a change in tightness, or other condition, may be determined by the control system based on sensing a change in magnetic signature of a magnetizable array at least partially within the fastener (as discussed above), again, tested over time, at intervals which may be predetermined by a user and/or the control system. In some embodiments, where the fastener tightness has decreased and/or a bend or breakage of the fastener has occurred, the magnetizable array will generate a different characteristic magnetic field when tested, matching or indicating model magnetic signatures associated with such conditions, as discussed above.

It should also be noted that, in some embodiments, as pictured, self-tightening fastener 1901 include a shank 1934, and screw threads, such as the example threading shown as threading 1935, in lower section 1929. In some embodiments, magnetizable array 1903 is at least partially included within such a lower section, as pictured. However, in some embodiments, other forms of fasteners, without a separate head and lower section (e.g., headless rivets or pins), or with other components, may be used, and the various components of self-tightening fastener 1901 may be provided in such other sections (e.g., at one end, which may be rotationally mounted to the remainder of the rivet or pin), as will be apparent to those of skill in the art. In other words, the example of a fastener type with a head, shank and threads, provided in the present figure, is only an example of the virtually unlimited types of fasteners, known and to be developed, which may be used to carry out aspects set forth in the present application, as will be apparent to those of skill in the art.

It should also be noted that, in some embodiments, permanent magnets, rather than a magnetizable array, may instead, or in addition, be used, in any and all of the embodiments set forth above for magnetizable arrays. Similarly, arrays of any known location beacons, particles, tags or other devices, may be used, in some embodiments, instead of such magnetic or magnetizable arrays, in various embodiments, the changing positions of which may result in different sensations by sensors, with different resulting signatures for such sensation (rather than magnetic field sensation) in such embodiments. Of course, in such embodiments, control systems monitoring and applying remedial actions, as discussed above, would then store a library of such alternative signatures, and compare sensor readings and data to those models.

In some embodiments, moving parts may be eliminated, for example, by substituting head section 1923 with a fixed head, integral with lower fastener section 1929. In some such embodiments, remote tightening and other actuation of an actuator may still be carried out. For example, such a fixed head may be such as that provided above, in reference to FIG. 11, and an external control system may apply rotating magnetic field or other actuation force to such a fixed head, as a remedial action to address adverse conditions of the fastener.

In various embodiments for control systems, fasteners, systems, methods and other aspects set forth in the present application, any of the aspects may be combined with any other aspects set forth elsewhere in this application. Similarly, any of the aspects set forth for an embodiment may be practiced separately, where possible. For example, in some embodiments, fasteners similar to self-tightening fastener may include tightness and other condition monitoring aspects for fasteners set forth above, without the self-tightening aspects. The listing or discussion of example embodiments, combining particular aspects, are only exemplary of the virtually unlimited number and variety of embodiments falling within the scope of the invention, as will be apparent to those of ordinary skill in the art.

What is claimed is:

1. A fastener monitoring and management system comprising:
    one or more fastener(s), comprising one or more sensor(s) and one or more actuator(s) on-board the fastener, wherein the one or more fastener(s) is communicatively connected with a control system, and wherein said control system performs operations to:
    determine whether a change in seating, bending or breakage, or other adverse change in condition(s) of the fastener(s) and/or a material in which the fastener(s) is within, has occurred;
    generate a signal, relaying data related to said change in condition of the fastener(s), triggering remedial actions, at least in part, by the control system, by actions of the actuator(s) on-board the fastener(s).

2. The fastener monitoring and management system of claim 1, wherein:
    the change in condition(s) of the fastener(s) comprise a loosening of at least one of the fastener(s).

3. The fastener monitoring and management system of claim 2, wherein:
    said loosening of said at least one of the fastener(s) is determined by said control system based on sensing a decrease in driving power necessary to tighten said at least one of the fastener(s).

4. The fastener monitoring and management system of claim 1, wherein the actuator(s) comprise at least one motor(s).

5. The fastener monitoring and management system of claim 4, wherein:
    said loosening of said at least one of the fastener(s) is determined by said control system based on sensing a decrease in driving power necessary to tighten said at least one of the fasteners.

6. The fastener monitoring and management system of claim 1, wherein the one or more sensor(s) comprise a magnetizable array, located at least partially on, in or about said one or more fastener(s).

7. The fastener monitoring and management system of claim 6, wherein the control system determines that the adverse change in condition(s) of the fastener(s) has occurred, based, at least in part, on a change in a magnetic signature of said magnetizable array.

8. The fastener monitoring and management system of claim 7, wherein the control system comprises a data library comprising a plurality of model characteristics of magnetic signatures, related to different conditions of fasteners, and wherein said control system compares readings from said sensor(s) to said data library.

9. The fastener monitoring and management system of claim 8, wherein the control system compares and matches said readings from said sensor(s) to at least one of said plurality of model characteristics of magnetic signatures.

10. The fastener monitoring and management system of claim 9, wherein the control system compares and matches said readings from said sensor(s) to at least one of said plurality of model characteristics of magnetic signatures by applying a matching algorithm.

11. The fastener monitoring and management system of claim 10, wherein the control system compares and matches said readings from said sensor(s) to at least one of said plurality of model characteristics of magnetic signatures by applying a confidence interval.

12. The fastener monitoring and management system of claim 10, wherein the adverse change in condition(s) of the fastener(s) and/or a material in which the fastener(s) is within is a breakage of at least part of one of the fastener(s).

13. The fastener monitoring and management system of claim 6, wherein the magnetizable array comprises charge-carrying projections.

14. The fastener monitoring and management system of claim 13, wherein the charge-carrying projections include tips or other parts configured to contact a material in which the one or more fastener(s) is fastened.

15. A fastener with signaling and self-actuation capabilities, comprising:
    one or more sensor(s) and one or more actuator(s) on-board the fastener, wherein the fastener is communicatively connected with a control system, and wherein said control system performs operations to:
    determine whether a change in seating, bending or breakage, or other adverse change in condition(s) of the fastener and/or a material in which the fastener is within, has occurred;
    generate a signal, relaying data related to said change in condition of the fastener, triggering remedial actions, at least in part, by the control system, by actions of the actuator(s) on-board the fastener.

16. A method for monitoring and management at least one fastener(s) comprising:
    providing:
    one or more fastener(s), comprising one or more sensor(s) and one or more actuator(s) on-board the fastener, wherein the one or more fastener(s) is communicatively connected with a control system, and wherein said control system performs operations to:
    determine whether a change in seating, bending or breakage, or other adverse change in condition(s) of the fastener(s) and/or a material in which the fastener(s) is within, has occurred;
    generate a signal, relaying data related to said change in condition of the fastener(s), triggering remedial actions, at least in part, by the control system, by actions of the actuator(s) on-board the fastener(s).

* * * * *